(12) United States Patent
Ozaki

(10) Patent No.: US 10,276,671 B2
(45) Date of Patent: Apr. 30, 2019

(54) SEMICONDUCTOR DEVICE, METHOD FOR MANUFACTURING SEMICONDUCTOR DEVICE, AND ELECTRONIC DEVICE

(71) Applicant: FUJITSU LIMITED, Kawasaki-shi, Kanagawa (JP)

(72) Inventor: Shirou Ozaki, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/798,843

(22) Filed: Oct. 31, 2017

(65) Prior Publication Data

US 2018/0182854 A1 Jun. 28, 2018

(30) Foreign Application Priority Data

Dec. 28, 2016 (JP) ................. 2016-254877

(51) Int. Cl.
*H01L 29/40* (2006.01)
*H01L 49/02* (2006.01)
(Continued)

(52) U.S. Cl.
CPC ........ *H01L 29/408* (2013.01); *H01L 23/3114* (2013.01); *H01L 23/4821* (2013.01); *H01L 23/4952* (2013.01); *H01L 23/49513* (2013.01); *H01L 23/66* (2013.01); *H01L 27/0629* (2013.01); *H01L 28/60* (2013.01); *H01L 29/2003* (2013.01); *H01L 29/205* (2013.01); *H01L 29/401* (2013.01); *H01L 29/66462* (2013.01); *H01L 29/7787* (2013.01); *H02M 1/4208* (2013.01); *H02M 5/458* (2013.01); *H03F 1/3241* (2013.01);
(Continued)

(58) Field of Classification Search
CPC ............. H01L 29/408; H01L 23/49513; H01L 27/0629; H01L 23/3114; H03F 3/193; H03F 1/3241; H02M 5/458
See application file for complete search history.

(56) References Cited

U.S. PATENT DOCUMENTS 8,283,248 B2* 10/2012 Kim ..................... H01L 21/764
257/E21.199
8,587,092 B2* 11/2013 Makiyama ............ C23C 16/345
257/640
(Continued)

FOREIGN PATENT DOCUMENTS

JP H11-274175 A 10/1999
JP 2009-272433 A 11/2009
JP 2015-204365 A 11/2015

*Primary Examiner* — William Coleman
(74) *Attorney, Agent, or Firm* — Kratz, Quintos & Hanson, LLP

(57) ABSTRACT

A semiconductor device includes a compound semiconductor layer, a gate electrode, and first and second insulating layers. The first insulating layer covers the gate electrode on the compound semiconductor layer and has a cavity that surrounds the gate electrode. The second insulating layer is provided on the first insulating layer and has an opening at a position corresponding to the cavity. A part of the second insulating layer, which is provided on the first insulating layer that covers the gate electrode, corresponding to the cavity is removed via the opening, so that the generation of parasitic capacitance due to the second insulating layer is suppressed.

12 Claims, 22 Drawing Sheets

(51) Int. Cl.

| | |
|---|---|
| *H01L 29/20* | (2006.01) |
| *H01L 29/205* | (2006.01) |
| *H01L 29/778* | (2006.01) |
| *H01L 23/66* | (2006.01) |
| *H01L 29/66* | (2006.01) |
| *H01L 23/495* | (2006.01) |
| *H01L 23/31* | (2006.01) |
| *H02M 1/42* | (2007.01) |
| *H02M 5/458* | (2006.01) |
| *H03F 1/32* | (2006.01) |
| *H03F 3/193* | (2006.01) |
| *H03F 3/213* | (2006.01) |
| *H01L 27/06* | (2006.01) |
| *H01L 23/482* | (2006.01) |
| *H03F 3/195* | (2006.01) |
| *H03F 3/24* | (2006.01) |

(52) U.S. Cl.
CPC ........... *H03F 1/3247* (2013.01); *H03F 3/193* (2013.01); *H03F 3/195* (2013.01); *H03F 3/213* (2013.01); *H03F 3/245* (2013.01); *H01L 23/49562* (2013.01); *H01L 2223/6683* (2013.01)

(56) References Cited

U.S. PATENT DOCUMENTS

| | | | |
|---|---|---|---|
| 8,735,863 B2 * | 5/2014 | Fowler | H01L 45/00 257/2 |
| 8,878,333 B2 * | 11/2014 | Nogami | H01L 23/482 257/522 |
| 9,365,411 B2 * | 6/2016 | Ebina | B81C 1/00293 |
| 9,368,362 B2 * | 6/2016 | Rha | H01L 21/306 |
| 9,632,355 B2 * | 4/2017 | Nam | G02F 1/133603 |
| 9,653,347 B1 * | 5/2017 | Leobandung | H01L 21/7682 |
| 9,698,245 B2 * | 7/2017 | Cheng | H01L 29/66666 |
| 9,725,310 B2 * | 8/2017 | Cheng | B81C 1/00246 |
| 9,935,115 B2 * | 4/2018 | Naito | H01L 27/11517 |
| 9,975,762 B2 * | 5/2018 | Chu | B81C 1/00238 |
| 10,043,727 B2 * | 8/2018 | Ozaki | H01L 23/296 |
| 2015/0295074 A1 | 10/2015 | Ozaki | |

* cited by examiner

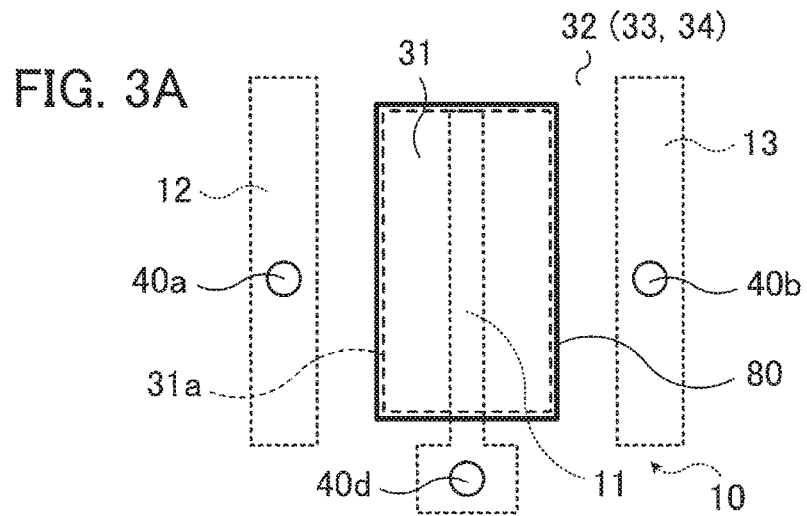
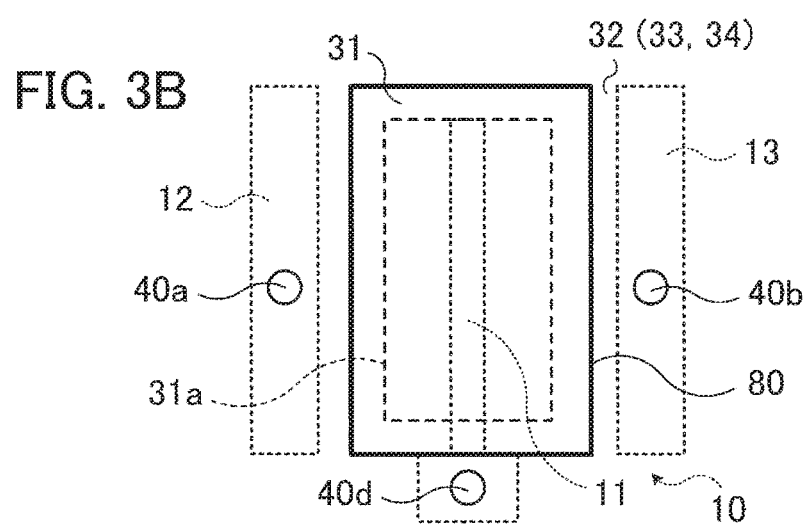
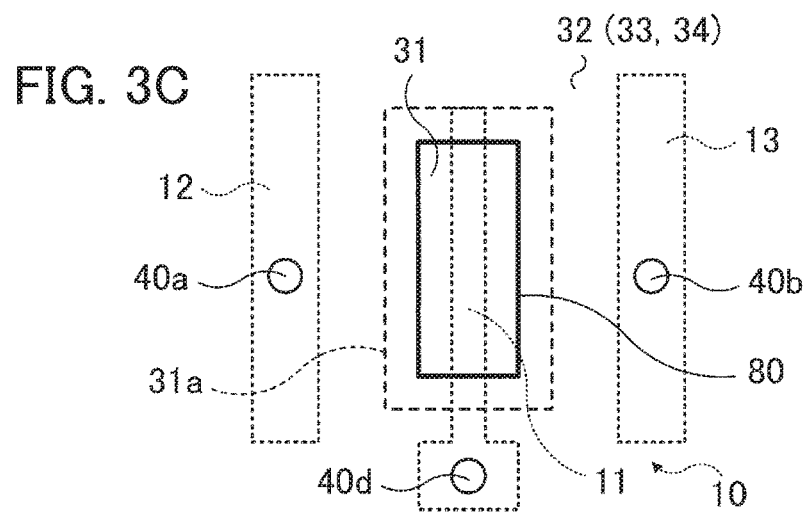

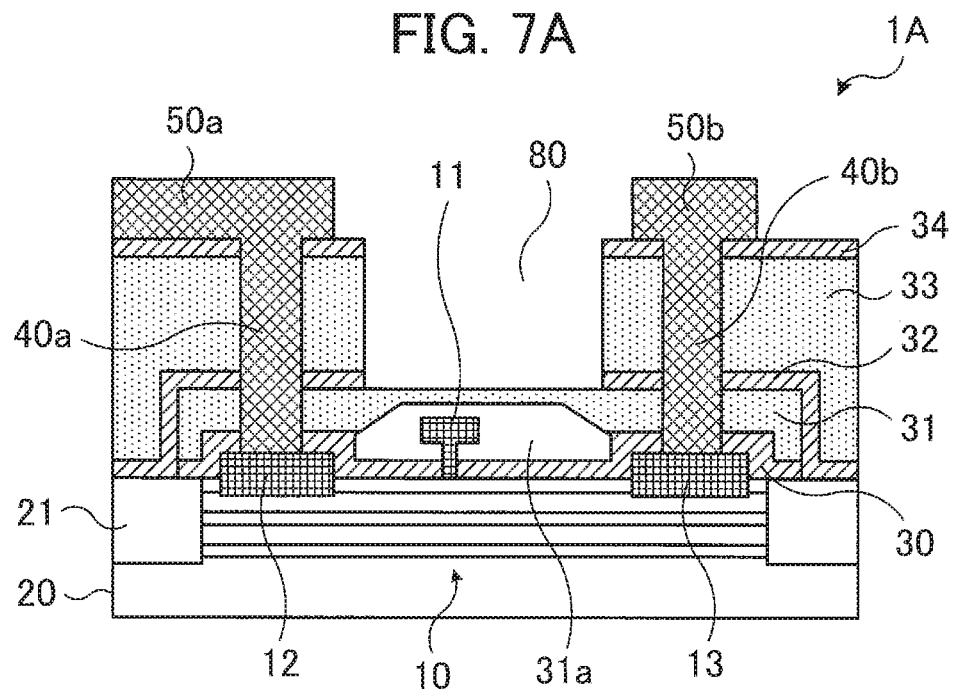
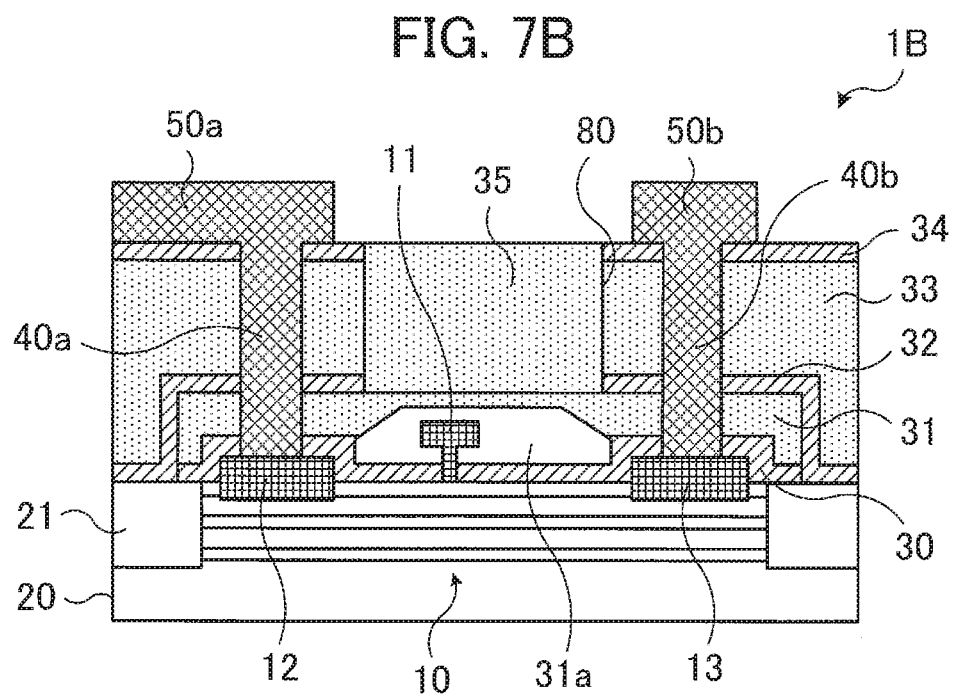

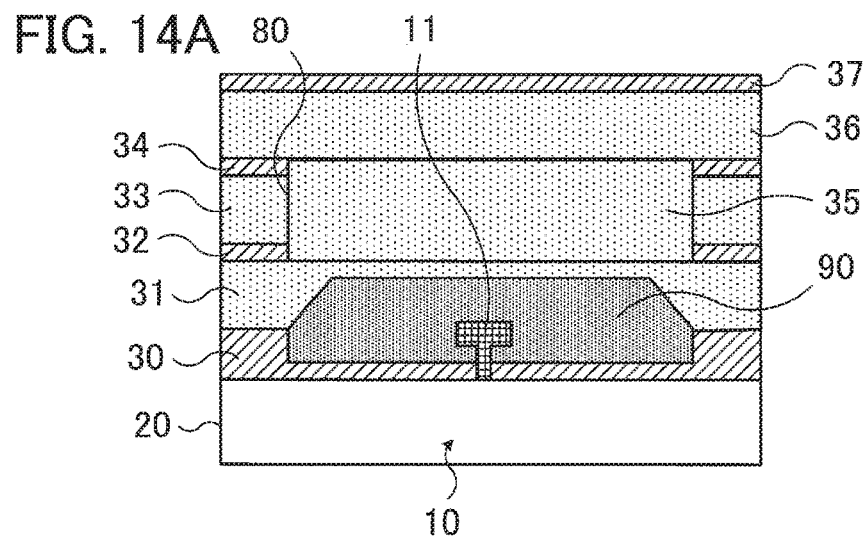
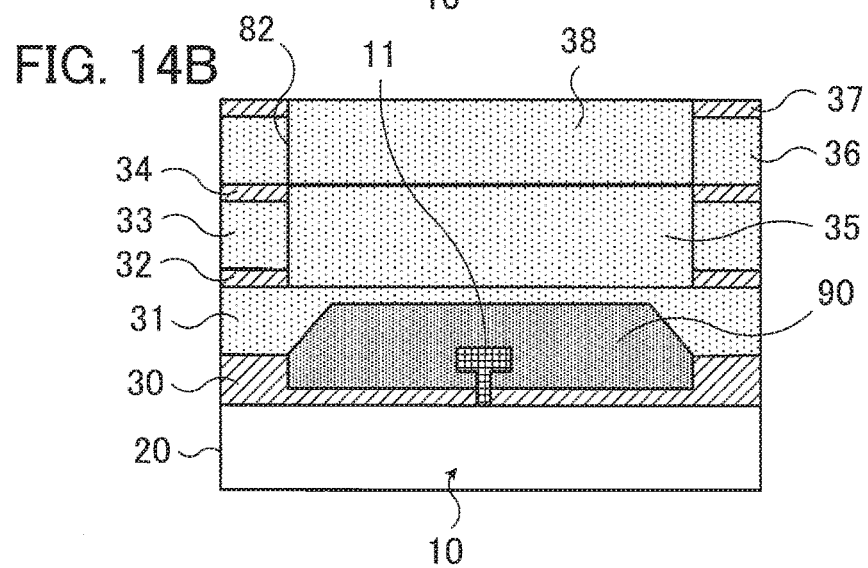
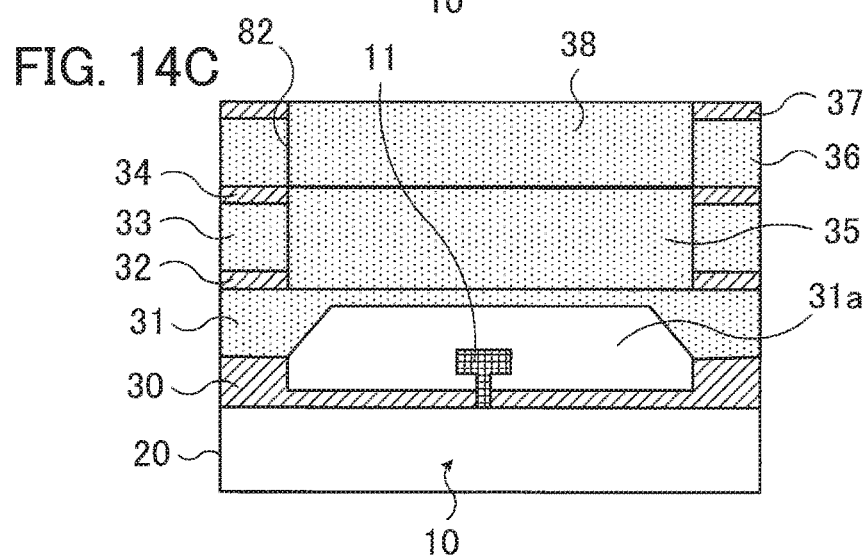

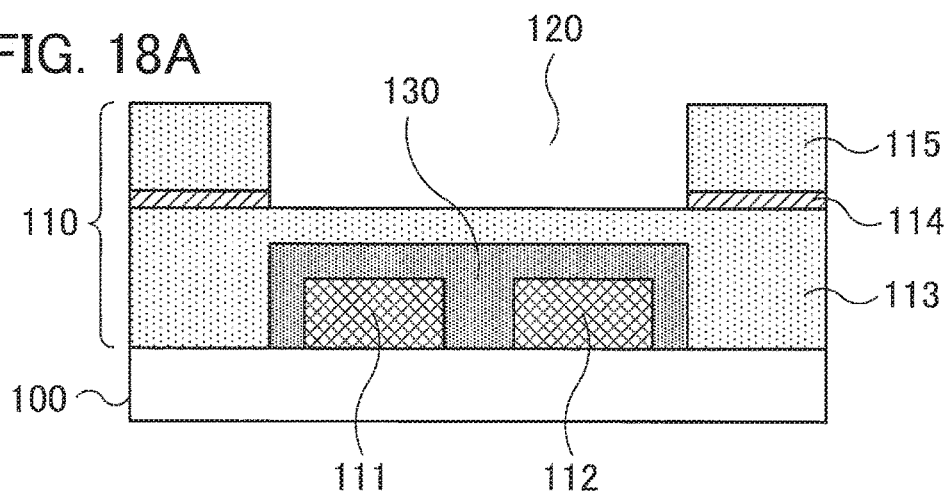
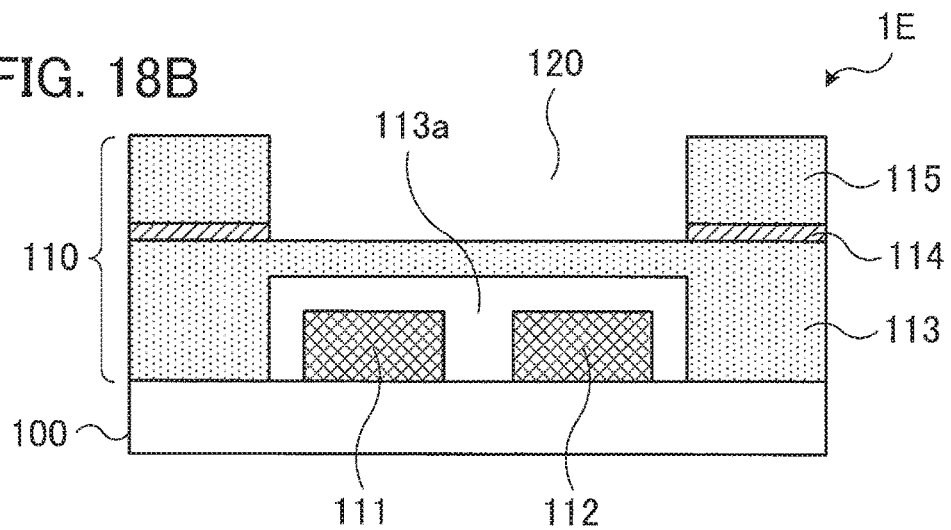
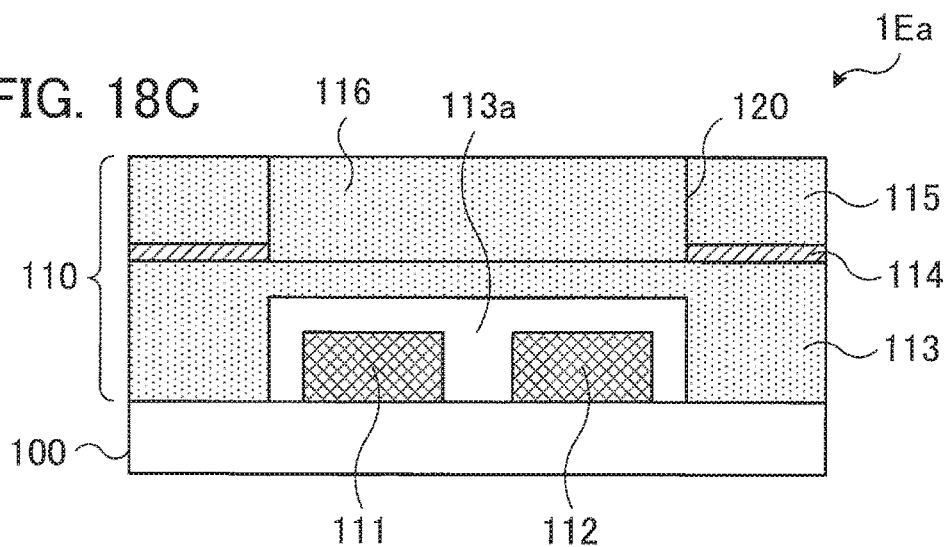

SEMICONDUCTOR DEVICE, METHOD FOR MANUFACTURING SEMICONDUCTOR DEVICE, AND ELECTRONIC DEVICE

CROSS-REFERENCE TO RELATED APPLICATION

This application is based upon and claims the benefit of priority of the prior Japanese Patent Application No. 2016-254877, filed on Dec. 28, 2016, the entire contents of which are incorporated herein by reference.

FIELD

The embodiments discussed herein are related to a semiconductor device, a method for manufacturing a semiconductor device, and an electronic device.

BACKGROUND

Two known technologies for reducing the parasitic capacitance generated in a semiconductor device are a technology where the permittivity of an insulating layer that covers a gate electrode or wiring is reduced and a technology where an insulating layer that covers a gate electrode or wiring is provided with a cavity (space) surrounding the gate electrode or wiring.

See, for example, the following documents.
Japanese Laid-open Patent Publication No. 11-274175
Japanese Laid-open Patent Publication No. 2009-272433
Japanese Laid-open Patent Publication No. 2015-204365

For a semiconductor device provided with an insulating layer that covers the gate electrode or wiring and has a cavity surrounding the gate electrode or wiring, when a further insulating layer is provided on top of the insulating layer, there is the risk of parasitic capacitance being generated due to this upper insulating layer, which would cause deterioration in the characteristics of the semiconductor device.

SUMMARY

According to one aspect, there is provided a semiconductor device including: a substrate; a first conductor provided on the substrate; a first insulating layer which is provided on the substrate, covers the first conductor, and has a cavity that surrounds the first conductor; and a second insulating layer which is provided on the first insulating layer and has an opening at a position corresponding to the cavity.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A to 3C depict a cavity and an opening according to the first embodiment;
FIGS. 7A and 7B are third diagrams depicting a method for forming a semiconductor device according to the second embodiment;
FIGS. 14A to 14C depict a different example of a method for forming a semiconductor device according to the fourth embodiment;
FIGS. 18A to 18C depict (a second part of) a method for forming a semiconductor device according to the fifth embodiment.

DESCRIPTION OF EMBODIMENTS

Figure 1:
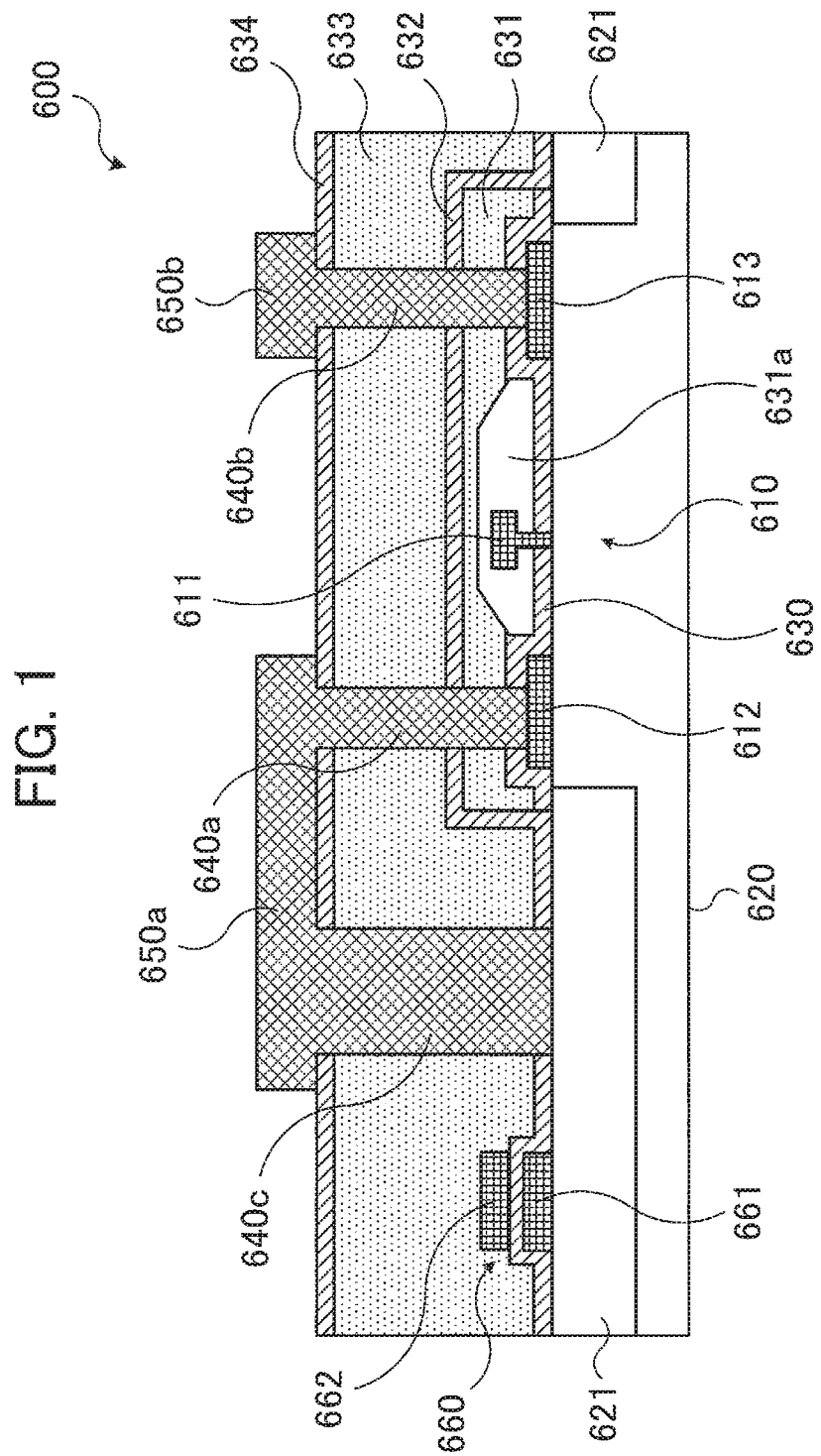
FIG. 1 depicts one example of a semiconductor device.

Several embodiments will be described below with reference to the accompanying drawings, wherein like reference numerals refer to like elements throughout.

FIG. 1 depicts one example of a semiconductor device. FIG. 1 schematically depicts a principal part of this example of a semiconductor device in cross section.

A semiconductor device 600 depicted in FIG. 1 is equipped with a high electron mobility transistor (HEMT) 610.

A compound semiconductor layer 620 including a channel layer (electron transit layer), a spacer layer, an electron supply layer, a cap layer, and the like is used in the semiconductor device 600.

A gate electrode 611 of the HEMT 610 is provided together with a pair of electrodes 612 and 613 in an active region defined by an element isolation region 621 of the compound semiconductor layer 620. The electrode 612 is used as a source electrode or a drain electrode of the HEMT 610 and is connected to (the electron supply layer of) the compound semiconductor layer 620. The electrode 613 is used as the drain electrode or the source electrode of the HEMT 610 and is connected to (the electron supply layer of) the compound semiconductor layer 620. An insulating layer 630 is formed using silicon nitride (SiN), silicon oxide (SiO$_2$), or the like in the active region, and the gate electrode 611 passes through the insulating layer 630 and is connected to (the cap layer of) the compound semiconductor layer 620. In FIG. 1, the gate electrode 611 whose cross-sectional form is T-shaped is illustrated.

The HEMT 610 is covered with an insulating layer 631 that uses a material with a relatively low permittivity, such as a so-called "Low-k material". The insulating layer 631 has a cavity 631a that surrounds the gate electrode 611. In the semiconductor device 600, an insulating layer 632, which uses a material with a relatively high permittivity such as SiN, is provided on the insulating layer 631, and an insulating layer 633, which uses a material with a relatively low permittivity such as a Low-k material, is further provided on the insulating layer 632. As one example, an insulating layer 634 which uses a material with a relatively high permittivity, such as SiN, is provided on the insulating layer 633. As the material with a relatively high permittivity used in the insulating layer 631 and the insulating layer 633, it is possible to use silsesquioxane. This material has a cage-like molecular structure, so that holes due to the molecular structure are formed inside the insulating layer 631 and the insulating layer 633 formed using silsesquioxane. That is, the insulating layer 631 and the insulating layer 633 are porous layers.

Contacts 640a, 640b, 640c are provided so as to pass through the insulating layer 634, the insulating layer 633, the insulating layer 632, the insulating layer 631, and the insulating layer 630. Wiring 650a that is connected to the contact 640a and the contact 640c and wiring 650b that is connected to the contact 640b are provided on the insulating layer 634. The contact 640a and the wiring 650a are connected to the electrode 612 of the HEMT 610 and the contact 640b and the wiring 650b are connected to the electrode 613 of the HEMT 610. The contact 640c, which is joined to the electrode 612 of the HEMT 610 via the wiring 650a and the contact 640a, is connected for example to conductors (not illustrated), such as vias and backside electrodes provided on the compound semiconductor layer 620.

In addition, a passive element, for example, a capacitor 660, is mounted together with the HEMT 610 on the compound semiconductor layer 620 of the semiconductor device 600. In the semiconductor device 600, a capacitor 660, which is configured by sandwiching a part of the insulating layer 632 that has a relatively high permittivity between a lower electrode 661 and an upper electrode 662, is provided on the compound semiconductor layer 620.

HEMT have superior high-speed characteristics and are used in the signal processing circuits of optical communication systems and other high-speed digital circuits. In particular, since HEMT have excellent low-noise characteristics, they are expected to be utilized in amplifiers for microwave and millimeter wave bands. When operating an amplifier in the millimeter wave bands, a high current gain cutoff frequency (fT) is demanded to obtain a sufficient amplification gain. For this reason, in addition to improving the transconductance (gm), which is a parameter related to the amplification factor of a transistor, it is important to shorten the gate length to reduce the capacitance between the gate and the source. In addition, when a monolithic microwave integrated circuit (MMIC) is produced to reduce the module size, a parasitic capacitance is generated by the insulating layer between the wiring, which makes it important to reduce the permittivity of the insulating film. Accordingly, a material with a relatively low permittivity, such as benzocyclobutene or polysilazane, is used for the (insulating material of the) wiring layer of the MMIC. A technique for removing the insulation material to hollow out a cavity that surrounds a HEMT, where the influence on the high frequency characteristics is large, has been proposed.

When, as in the semiconductor device 600 depicted in FIG. 1, a cavity 631a is provided in the insulating layer 631 covering the HEMT 610 at a part that surrounds the gate electrode 611, the parasitic capacitance generated between the gate electrode 611 and other conductors is reduced compared to a configuration where an insulating material (Low-k material, SiN, or the like) is provided at the same part. With the semiconductor device 600, by reducing the parasitic capacitance by providing the cavity 631a, deterioration in the characteristics of the HEMT 610, for example, the high-frequency characteristics where full use is made of the high speed of the HEMT 610, is suppressed.

However, in the semiconductor device 600 with the configuration described above, to construct an MMIC, the insulating layer 632 and the insulating layer 633 for example are further provided on top of the insulating layer 631 that covers the HEMT 610 and has the cavity 631a which surrounds the gate electrode 611. Out of these layers, a material with a relatively low permittivity, such as a Low-k material, is used for the insulating layer 631 and the insulating layer 633, and a material with a relatively high permittivity, such as SiN, is used for the insulating layer 632. Due to the insulating layer 632 with a relatively high permittivity being provided on top of the insulating layer 631 with a relatively low permittivity, there is the possibility of parasitic capacitance being generated in the semiconductor device 600 due to the insulating layer 632. There is the risk of this parasitic capacitance generated due to the insulating layer 632 causing deterioration in characteristics, such as the high-frequency characteristics, of the semiconductor device 600.

The insulating layer 632 that uses a material with a relatively high permittivity, such as SiN, may be used for example as a hard mask when etching the insulating layer 631 that uses a material with a relatively low permittivity, such as a Low-k material, and/or may be used as a dielectric of the capacitor 660 in the MMIC. This means that it is difficult to produce an MMIC semiconductor device 600 with a configuration that does not include the insulating layer 632.

As one example, the following method is used to form the cavity 631a. First, a sacrificial layer (filler) that uses a material that decomposes under light, such as ultraviolet rays, is formed on the insulating layer 630 above the compound semiconductor layer 620 in which the HEMT 610 is formed, so as to cover the gate electrode 611. The porous insulating layer 631 is formed on this sacrificial layer. After this, irradiation with light, such as ultraviolet rays, is performed to cause decomposition and gasification of the sacrificial layer surrounding the gate electrode 611. The components of the gasified sacrificial layer are removed through the holes in the porous insulating layer 631. By removing the sacrificial layer, the cavity 631a is formed so as to surround the gate electrode 611.

With a method that uses light to cause decomposition and gasification of a sacrificial layer to remove the sacrificial layer through the holes in the insulating layer 631, to remove the sacrificial layer, it is needless to form holes that pass through the insulating layer 631 and reach the sacrificial layer. For this reason, holes that reach the cavity 631a that surrounds the gate electrode 611 are not formed, which is effective from the viewpoint of achieving moisture resistance.

However, when the insulating layer 632 is also formed using a material with a relatively high permittivity, such as SiN, on top of the insulating layer 631 as described above, there is a drop in the transmittance of light, such as ultraviolet rays, which may result in insufficient decomposition and gasification of the sacrificial layer. In addition, an insulating layer 632 formed using a material with a relatively high permittivity, such as SiN, is a denser film than the porous insulating layer 631 that has a relatively low permittivity. When a relatively dense insulating layer 632 is present on the insulating layer 631 as described above, even when the sacrificial layer is caused to decompose and is gasified using light, it is difficult for the components of the gasified sacrificial layer to escape through the insulating layer 632, so that the sacrificial layer may be left around the gate electrode 611, preventing the parasitic capacitance from being sufficiently reduced.

In view of the problems described above, the configurations given in the following embodiments are used to realize semiconductor devices that each have a cavity that surrounds the gate electrode.

First, a first embodiment will be described.

Figure 2:
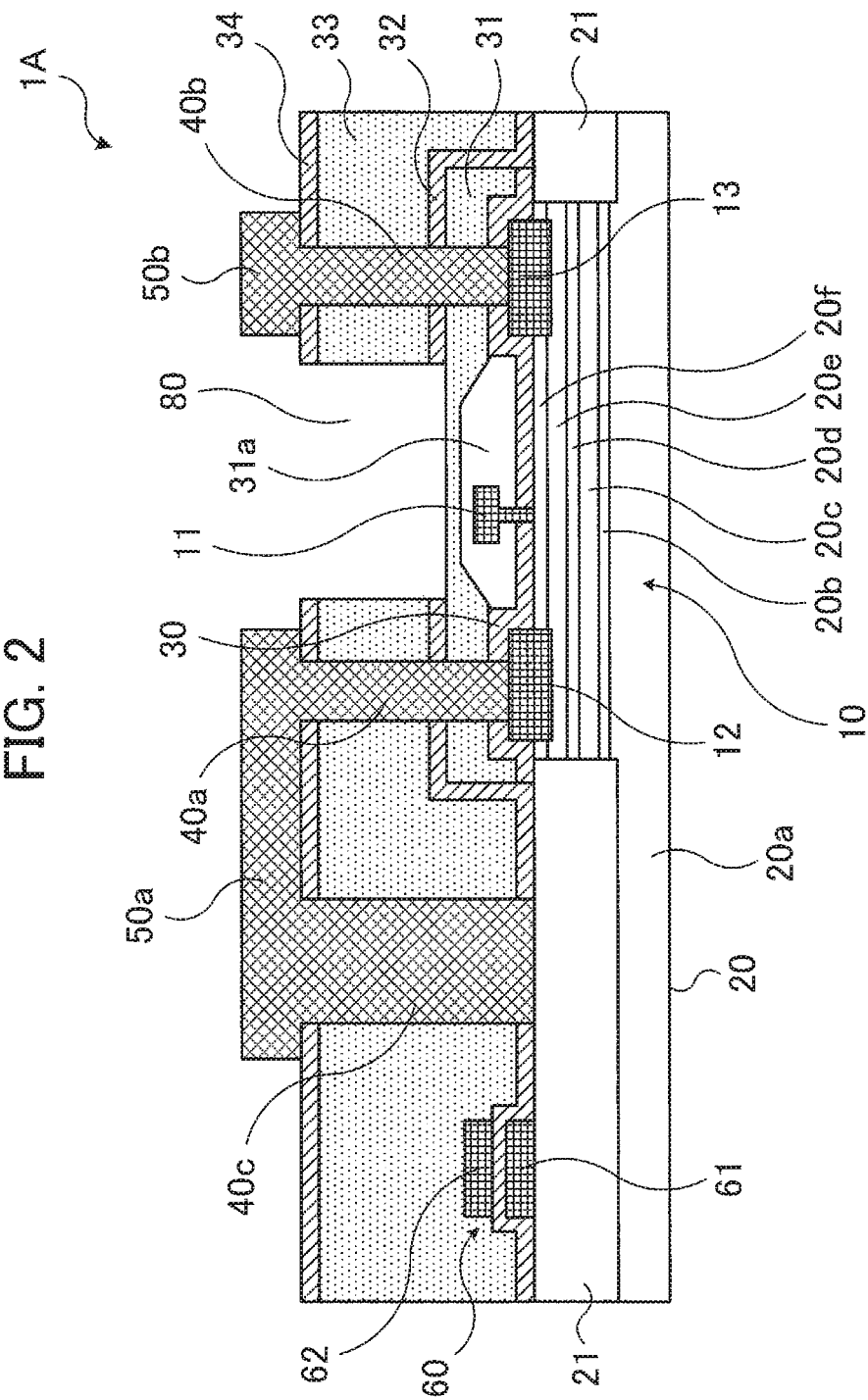
FIG. 2 depicts a first example configuration of a semiconductor device according to a first embodiment.

FIG. 2 depicts a first example configuration of a semiconductor device according to the first embodiment. FIG. 2 schematically depicts a principal part of the first example configuration of a semiconductor device according to the first embodiment in cross section.

A semiconductor device 1A depicted in FIG. 2 includes a compound semiconductor layer 20 and a HEMT 10 formed using the compound semiconductor layer 20.

The compound semiconductor layer 20 includes an electron transit layer 20c, a spacer layer 20d, an electron supply layer 20e, and a cap layer 20f that are stacked on a semiconductor substrate 20a, such as silicon carbide (SiC), with a buffer layer 20b in between.

When the HEMT 10 is configured as a GaN-type HEMT, where gallium nitrogen (GaN) and aluminum gallium nitrogen (AlGaN) are used as materials, the following structure is used for example as the compound semiconductor layer 20. i-type GaN layers (i-GaN) are used for the buffer layer 20b and the electron transit layer 20c. An i-type AlGaN layer (i-AlGaN) is used for the spacer layer 20d. An n-type AlGaN layer (n-AlGaN) is used for the electron supply layer 20e. An n-type GaN layer (n-GaN) is used for the cap layer 20f. Due to piezoelectric polarization produced by the strain caused by the difference in lattice constants between GaN and AlGaN and spontaneous polarization of the AlGaN, two-dimensional electron gas (2DEG) is formed in the vicinity of the upper surface of the electron transit layer 20c.

A gate electrode 11 of the HEMT 10 and a pair of electrodes 12 and 13 are provided in an active region defined by an element isolation region 21 of the compound semiconductor layer 20. The electrode 12 is used as a source electrode or a drain electrode of the HEMT 10, and the electrode 13 is used as a drain electrode or a source electrode of the HEMT 10. The electrode 12 and the electrode 13 are connected (ohmically connected) to the electron supply layer 20e of the compound semiconductor layer 20. Both the electrodes 12 and the electrode 13 are made of metal materials, such as titanium (Ti) or aluminum (Al).

An insulating layer 30 is formed using SiN or the like in the active region. The cap layer 20f of the compound semiconductor layer 20, and the electrode 12 and the electrode 13 are covered by the insulating layer 30. The gate electrode 11 passes through the insulating layer 30 and is connected to the cap layer 20f. In FIG. 2, the gate electrode 11 whose cross-sectional form is T-shaped is illustrated. Metal materials, such as nickel (Ni) and gold (Au), are used for the gate electrode 11.

The HEMT 10 is covered with an insulating layer 31 that uses a material with a relatively low permittivity, such as a Low-k material. The insulating layer 31 has a cavity 31a that surrounds the gate electrode 11. In the semiconductor device 1A, the insulating layer 32 that uses a material with a relatively high permittivity, such as SiN, is provided on the insulating layer 31, and an insulating layer 33 that uses a material with a relatively low permittivity, such as a Low-k material, is further provided on the insulating layer 32. As one example, an insulating layer 34 that uses a material with a relatively high permittivity, such as SiN, is provided on the insulating layer 33. Silsesquioxane, for example, methyl silsesquioxane, is used as the material with a relatively low permittivity that is used for the insulating layer 31 and the insulating layer 33. This material has a cage-like molecular structure, so that holes due to the molecular structure are formed inside the insulating layer 31 and the insulating layer 33 that are formed using this material. That is, the insulating layer 31 and the insulating layer 33 are porous layers.

A contact 40a, a contact 40b, and a contact 40c are provided so as to pass through the insulating layer 34, the insulating layer 33, the insulating layer 32, the insulating layer 31, and the insulating layer 30. Wiring 50a connected to the contact 40a and the contact 40c and wiring 50b connected to the contact 40b are provided on the insulating layer 34. Also, although not depicted in the drawing, a contact that passes through the insulating layer 34, the insulating layer 33, the insulating layer 32, the insulating layer 31 and the insulating layer 30 and is connected to the gate electrode 11, and wiring connected to this contact are additionally provided.

The contact 40a and the wiring 50a are connected to the electrode 12 of the HEMT 10, and the contact 40b and the wiring 50b are connected to the electrode 13 of the HEMT 10. The contact 40c, which is joined to the electrode 12 of the HEMT 10 via the wiring 50a and the contact 40a, is connected to conductors (not illustrated), such as vias and backside electrodes provided on the compound semiconductor layer 20. Metal materials, such as titanium tungsten (TiW) and Au, are used for the contact 40a and the wiring 50a, and also the contact 40b and the wiring 50b. Similarly, metal materials are used for the other conductors, such as the contact 40c.

In addition, a passive element, such as a capacitor 60, is provided together with the HEMT 10 on the compound semiconductor layer 20 of the semiconductor device 1A. In the semiconductor device 1A, the capacitor 60, which is configured by sandwiching a part of the insulating layer 32 that has a relatively high permittivity between a lower electrode 61 and an upper electrode 62, is provided on the compound semiconductor layer 20.

In the semiconductor device 1A, above the insulating layer 31 that covers the gate electrode 11 of the HEMT 10 and has the cavity 31a that surrounds the gate electrode 11, an opening 80 is provided at a position corresponding to the cavity 31a of the insulating layer 31 so as to pass through the insulating layer 32, the insulating layer 33, and the insulating layer 34.

By being provided with the opening 80, the semiconductor device 1A is constructed so that the insulating layer 32 (and the insulating layer 34) that has a relatively high permittivity is partially removed from above (at least part of) the cavity 31a of the insulating layer 31. With this configuration, the parasitic capacitance generated between the gate electrode 11 positioned inside the cavity 31a and other conductors, for example, the electrode 12, the electrode 13, or the contact 40a or the contact 40b connected to the electrodes 12 and 13, is reduced. In the semiconductor device 1A, the cavity 31a is provided so as to surround the gate electrode 11 and the insulating layer 32, which has a relatively high permittivity, is removed by the opening 80 from above the cavity 31a, so that the generation of parasitic capacitance is suppressed. By doing so, deterioration in the characteristics, such as the high-frequency characteristics, of the semiconductor device 1A due to parasitic capacitance is suppressed.

In the semiconductor device 1A, the part of the insulating layer 32 remaining after the part above the cavity 31a has been removed may be used as a hard mask or may be used as the dielectric of the capacitor 60.

FIGS. 3A to 3C depict the cavity and the opening according to the first embodiment. FIGS. 3A to 3C schematically depict, when looking from the insulating layer 32 side, example planar layouts of principal parts of the HEMT 10 described above and the insulating layer 31 and the insulating layer 32 (and the insulating layers 33 and 34) provided on top of the HEMT 10.

For the HEMT 10, the electrodes 12 and 13 that each function as a source electrode or a drain electrode are provided on two sides of the gate electrode 11. The contact 40d is connected to the gate electrode 11, and the contact 40a and the contact 40b are respectively connected to the electrode 12 and the electrode 13. The cavity 31a of the insulating layer 31 that covers the gate electrode 11 is provided so as to surround the gate electrode 11. As one example, a configuration where the cavity 31a is provided in a region between the electrode 12 and the electrode 13 and encloses part of the gate electrode 11 is illustrated in the drawings.

The opening 80 is provided in the insulating layer 32 above the insulating layer 31 at a position corresponding to the cavity 31a of the insulating layer 31. As depicted in FIG. 3A for example, the opening 80 corresponding to the cavity 31a may be formed in a size that is the same or similar to the cavity 31a when looking from above.

Alternatively, as depicted in FIG. 3B for example, the opening 80 provided corresponding to the cavity 31a may be formed larger than the cavity 31a when looking from above with a size that overlaps and encloses the entire cavity 31a. Since it is possible, when an opening 80 of this size is provided, to increase the size of the region where the insulating layer 32 with a relatively high permittivity is not present above the cavity 31a, it is possible to effectively reduce the parasitic capacitance caused by the insulating layer 32. When the size of the opening 80 is made larger than the cavity 31a, it is possible to increase the efficiency of removal of the sacrificial layer when forming the cavity 31a using a method, described later, that gasifies and removes the sacrificial layer by photodecomposition.

As yet another alternative, as depicted in FIG. 3C for example, the opening 80 provided corresponding to the cavity 31a may be produced in a size that is smaller than the cavity 31a and overlaps part of the cavity 31a when looking from above. Since it is possible, even when an opening 80 of this size is provided, to provide a region where the insulating layer 32 with a relatively high permittivity is not present above the cavity 31a, it is possible to reduce the parasitic capacitance due to the insulating layer 32. However, it should be noted that when the size of the opening 80 is smaller than the cavity 31a, depending on the size of the opening 80, the removal efficiency of the sacrificial layer may fall when forming the cavity 31a using a method that gasifies and removes a sacrificial layer by photodecomposition as described later.

Note that although the cavity 31a that is a region between the electrode 12 and the electrode 13 and incorporates part of the gate electrode 11 is given here as an example, the region where the cavity 31a is disposed (or "disposed region") is not limited to this. As examples, the cavity 31a may be provided so as to extend outside the electrode 12 and the electrode 13, and may be provided so as to incorporate the entire gate electrode 11. It is possible to provide the opening 80 corresponding to the cavity 31a in keeping with the examples in FIGS. 3A to 3A based on the disposed region of the cavity 31a and with consideration to the layout of the contacts 40a to 40d and the like and the layout of the wiring 50a, 50b, and the like (which are not illustrated in FIGS. 3A to 3C) connected to the contacts 40a to 40d and the like.

Figure 4:
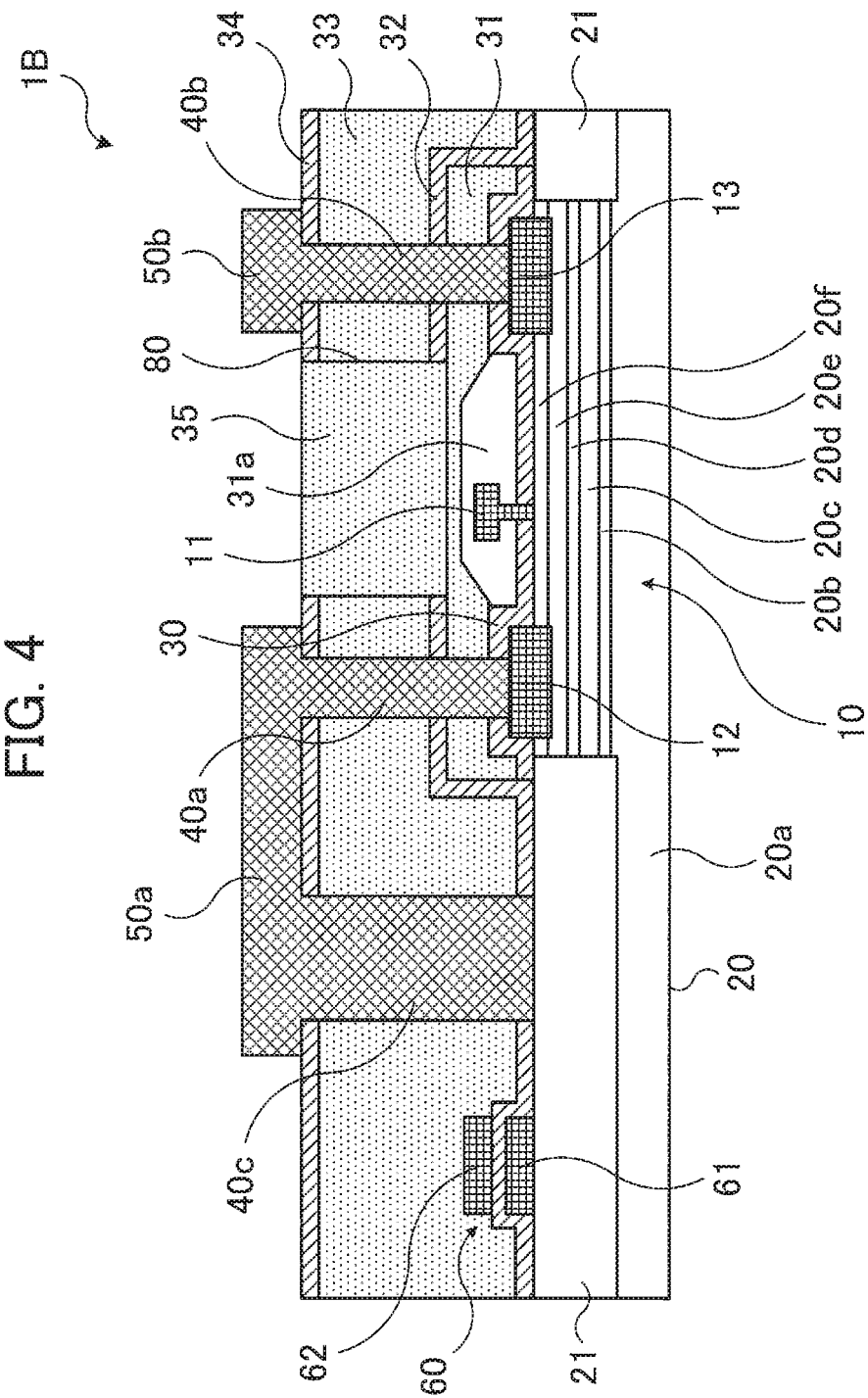
FIG. 4 depicts a second example configuration of a semiconductor device according to the first embodiment.

FIG. 4 depicts a second example configuration of a semiconductor device according to the first embodiment. FIG. 4 schematically depicts a principal part of the second example configuration of the semiconductor device according to the first embodiment in cross section.

A semiconductor device 1B depicted in FIG. 4 differs from the semiconductor device 1A described above by having a configuration where the opening 80 provided corresponding to the cavity 31a is filled with an insulating layer 35.

As one example, a material, such as a Low-k material, with a relatively low permittivity that is lower than the material, such as SiN, used for the insulating layer 32 is used as the insulating layer 35 that fills the opening 80. As this material, silsesquioxane, such as methyl silsesquioxane may be used. In this case, holes due to the cage-like molecular structure of the material are formed inside of the insulating layer 35 to be formed. That is, the insulating layer 35 is a porous layer. By using this material for the insulating layer 35, generation of parasitic capacitance due to the insulating portion provided above the cavity 31a is suppressed. In addition, by filling the opening 80 with the insulating layer 35, resistance to moisture is increased, so that penetration of moisture into the cavity 31a and the HEMT 10 and deterioration in the characteristics of the HEMT 10 due to moisture are suppressed.

When a material with relatively high transmittance of light, such as ultraviolet rays, and a relatively low density, such as a porous layer, is used as the insulating layer 35 that fills the opening 80, it is possible, after the opening 80 has been filled with the insulating layer 35, to form the cavity 31a using a method that gasifies and removes the sacrificial layer by photodecomposition as described later.

The insulating layer 35 that fills the opening 80 may have a single-layer structure but may alternatively have a laminated structure where one or two or more insulating layers with a relatively low permittivity are laminated. Also, the insulating layer 35 that fills the opening 80 may have a laminated structure provided with one or two or more insulating layers with a relatively low permittivity on the lower side and with one or two or more insulating layers with a relatively high permittivity on the upper side. Even when a layer with a relatively high permittivity is provided on the upper side, so long as this is distant from the gate electrode 11, generation of parasitic capacitance due to this layer with a relatively high permittivity is suppressed.

It should be noted that the HEMT 10 in the semiconductor device 1A and the semiconductor device 1B described above is not limited to the GaN-based HEMT described earlier which uses GaN and AlGaN as materials, and it is possible to configure a HEMT using other materials.

As examples, as the HEMT 10, it is possible to configure a GaN-type HEMT that uses GaN and indium aluminum nitride (InAlN) as materials or a GaN-type HEMT that uses GaN and indium aluminum gallium nitrogen (InAlGaN) as materials. For a GaN-type HEMT that uses GaN and InAlN, i-GaN is used for the electron transit layer 20c of the compound semiconductor layer 20, i-InAlN for the spacer layer 20d, n-InAlN for the electron supply layer 20e, and n-GaN is used as the cap layer 20f. For a GaN-type HEMT that uses GaN and InAlGaN, i-GaN is used for the electron transit layer 20c of the compound semiconductor layer 20, i-InAlGaN is used for the spacer layer 20d, n-InAlGaN is used for the electron supply layer 20e, and n-GaN is used for the cap layer 20f.

In addition, as the HEMT 10, aside from the various GaN-type HEMT described above, it is possible to configure an indium phosphorus (InP) type HEMT or the like.

Next, a second embodiment will be described.

Here, the second embodiment is described as an example of a method for forming the semiconductor device 1A and the semiconductor device 1B described in the first embodiment.

FIGS. 5A to 8B depict a method for forming a semiconductor device according to the second embodiment. FIGS. 5A to 5C, FIGS. 6A to 6C, FIGS. 7A and 7B, and FIGS. 8A and 8B schematically depict a principal part at each step in the method for forming a semiconductor device according to the second embodiment in cross section.

Figure 5A:
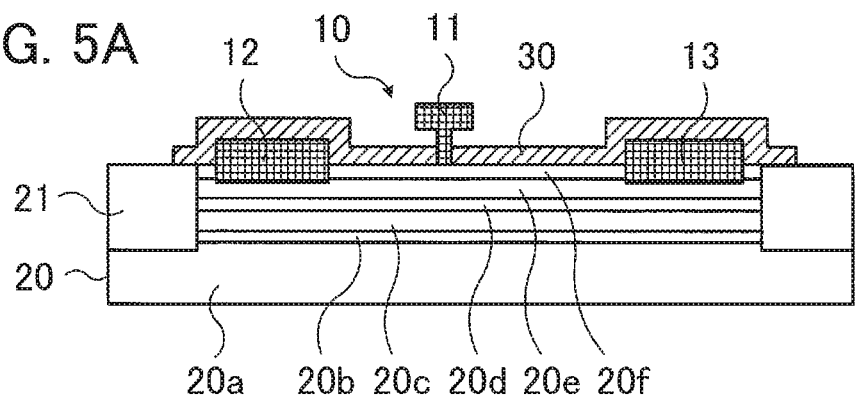
FIGS. 5A to 5C are first diagrams depicting a method for forming a semiconductor device according to a second embodiment.

First, as depicted in FIG. 5A, the compound semiconductor layer 20 (substrate) on which the HEMT 10 and the like have been formed is prepared.

For a GaN-type HEMT that uses GaN and AlGaN, first a buffer layer 20b and an electron transit layer 20c of i-GaN, a spacer layer 20d of i-AlGaN, an electron supply layer 20e of n-AlGaN, and a cap layer 20f of n-GaN are laminated in that order on a semiconductor substrate 20a of SiC or the like by MOVPE (Metal Organic Vapor Phase Epitaxy) for example to form the compound semiconductor layer 20.

After this, the element isolation region 21 is formed by ion implantation of argon (Ar), for example.

Next, the electrode 12 and the electrode 13 that are respectively used as a source electrode or a drain electrode are formed on the electron supply layer 20e.

At this time, first, a resist with an opening in a region where the electrode 12 and the electrode 13 are to be formed is formed on the cap layer 20f of the compound semiconductor layer 20 using a photolithography technique. By dry etching, for example dry etching using a chlorine-based gas, with the resist as a mask, the cap layer 20f exposed to the opening in the resist is removed. After this, the metal material that forms the electrode 12 and the electrode 13, for example a Ti film and an Al film, is laminated and deposited on the entire surface, that is, on the upper surface of the resist and in the opening, and the Ti film and the Al film deposited on the upper surface of the resist are removed together with the resist (this method is called "lift-off"). By doing so, a Ti film and an Al film are formed on regions of the electron supply layer 20e of the compound semiconductor layer 20 where the electrode 12 and the electrode 13 are to be formed.

Next, a heat treatment, for example a heat treatment in a nitrogen atmosphere at a temperature of 400 to 1000° C., is performed. By performing this heat treatment, the electrode 12 and the electrode 13 that are ohmically connected to the electron supply layer 20e are formed.

Next, an insulating layer 30 (protective layer) that covers the cap layer 20f, the electrode 12, and the electrode 13 is formed on the compound semiconductor layer 20. As one example, as the insulating layer 30, an SiN layer is formed by a CVD (Chemical Vapor Deposition) method.

After this, the gate electrode 11 that passes through the insulating layer 30 and is connected to the cap layer 20f is formed.

At this time, first, a resist with an opening in a region where the gate electrode 11 (for example, the leg portion of the T-shaped gate electrode 11) is to be formed is formed on the insulating layer 30 using a photolithography technique. The insulating layer 30 exposed to the opening of the resist is removed by dry etching, for example dry etching using sulfur hexafluoride ($SF_6$) gas, with the resist as a mask. After this, the resist is removed and a resist with an opening in a region that includes the region where the gate electrode 11 is to be formed is newly formed. Next, a metal material that forms the gate electrode 11, for example an Ni film and an Au film, is laminated and deposited on the entire surface, that is, on the upper surface of the newly formed resist and inside the opening, and after this, the resist is removed together with the Ni film and Au film deposited on the upper surface (this method is called "lift-off"). By doing so, a T-shaped gate electrode 11 is formed on the cap layer 20f of the compound semiconductor layer 20.

As one example, as depicted in FIG. 5A, by using this method, the compound semiconductor layer 20 on which the HEMT 10 and the like have been formed is obtained.

Figure 5B:
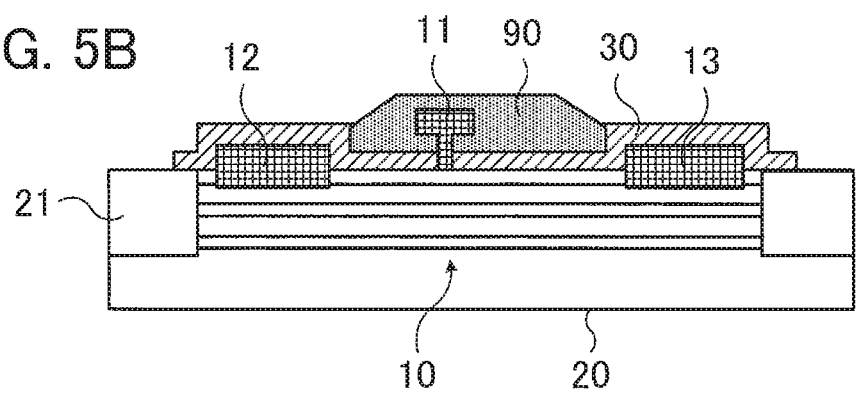

As depicted in FIG. 5B, a sacrificial layer 90 is formed on the compound semiconductor layer 20 on which the HEMT 10 and the like have been formed.

As the sacrificial layer 90, a material that decomposes under light, such as ultraviolet rays, is used. As one example, an organic layer that includes a functional group containing oxygen (carbonyl group (CO), carboxyl group (COOH), hydroxyl (OH), or the like) and is decomposed by ultraviolet rays with a wavelength of 300 to 400 nm is used as the sacrificial layer 90. In addition to methyl glutarimide, polymethyl methacrylate, polypropylene, and polycarbonate may be given as examples of this type of organic layer.

The material described above is formed by spin coating, for example, on the compound semiconductor layer 20 on which the HEMT 10 has been formed to form the sacrificial layer 90. The formed sacrificial layer 90 is patterned using a photolithography technique and an etching technique so as to remain in a predetermined region (or "disposed region"). As one example, the sacrificial layer 90 is patterned so as to remain in a region which, when viewed from above, is located between the electrode 12 and the electrode 13 and incorporates part or all of the gate electrode 11. Alternatively, the sacrificial layer 90 is patterned so as to remain in a region which, when viewed from above, incorporates part or all of the gate electrode 11 and also incorporates part or all of the electrode 12 and part or all of the electrode 13.

Figure 5C:
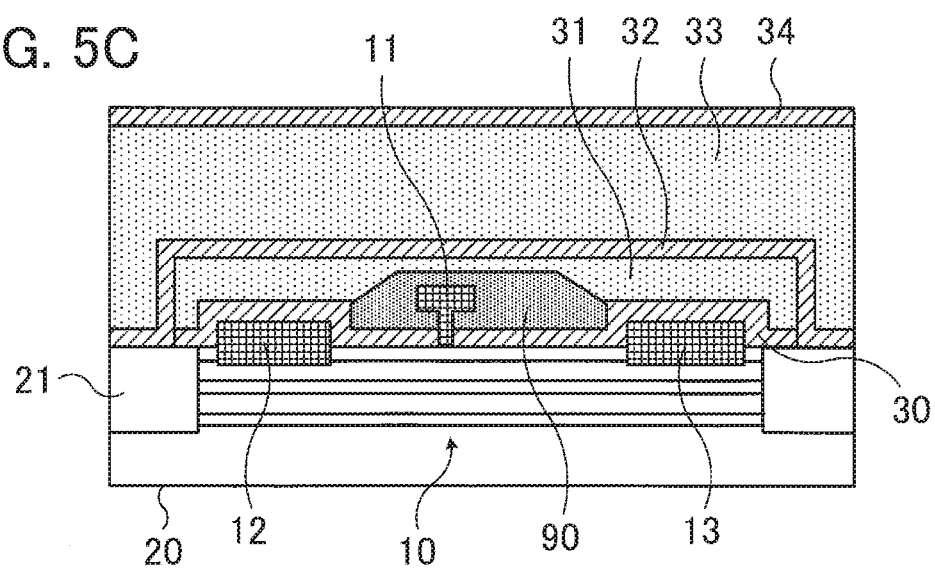

After formation of the sacrificial layer 90, as depicted in FIG. 5C, the insulating layer 31, the insulating layer 32, the insulating layer 33, and the insulating layer 34 are formed.

When doing so, first the insulating layer 31 is formed using a material with a relatively low permittivity so as to cover the sacrificial layer 90. As one example, a porous layer is formed as the insulating layer 31.

After this, the insulating layer 32 is formed using a material with a relatively high permittivity on the formed insulating layer 31. As one example, an SiN layer is formed as the insulating layer 32. Although omitted from the drawings, the insulating layer 32 is used as the dielectric of the capacitor 60 provided on the compound semiconductor layer 20. Note that in this case, the lower electrode 61 is formed in advance in a region where the capacitor 60 is to be formed before formation of the insulating layer 32, and after formation of the insulating layer 32, the upper electrode 62 that faces the lower electrode 61 with the insulating layer 32 in between is formed, thereby forming the capacitor 60.

Next, the insulating layer 33 is formed using a material with a relatively high permittivity on the formed insulating layer 32. As one example, a porous layer is formed as the insulating layer 33. The insulating layer 34 is then formed, using a material with a relatively high permittivity for example, on the formed insulating layer 33. As one example, an SiN layer is formed as the insulating layer 34.

Figure 6A:
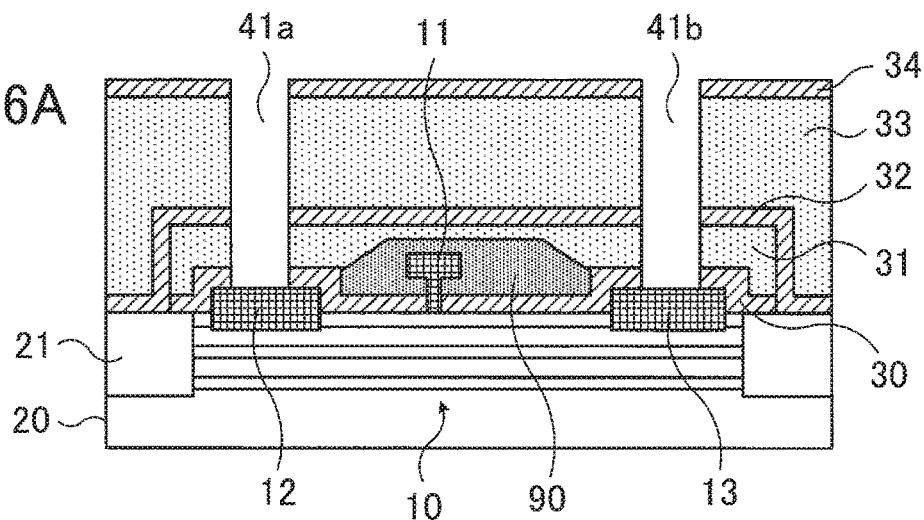
FIGS. 6A to 6C are second diagrams depicting a method for forming a semiconductor device according to the second embodiment.

After formation of the insulating layer 31, the insulating layer 32, the insulating layer 33, and the insulating layer 34, as depicted in FIG. 6A, a contact hole 41a and a contact hole 41b that respectively reach the electrode 12 and the electrode 13 are formed. Here, although omitted from the drawings, a contact hole that reaches the gate electrode 11 is also formed together with the contact hole 41a and the contact hole 41b.

Figure 6B:
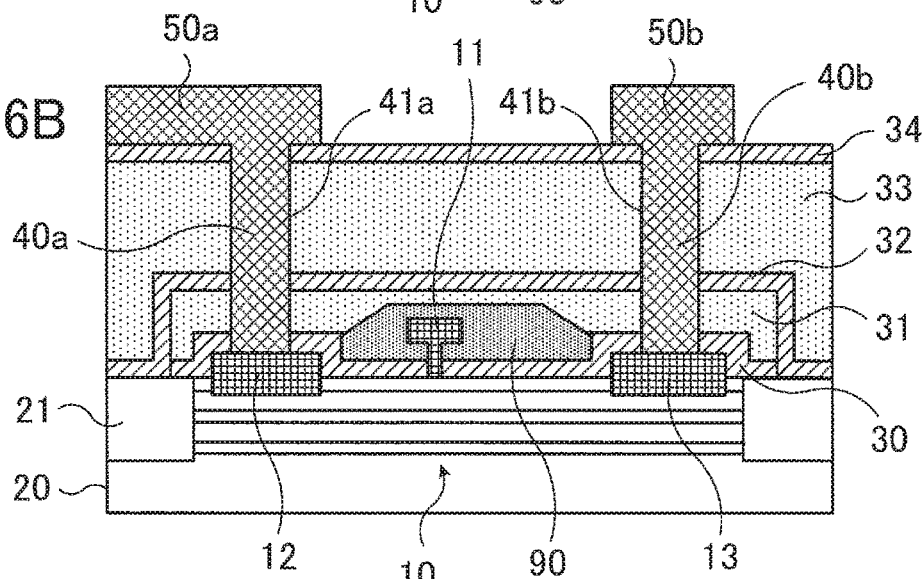

After formation of the contact hole 41a, the contact hole 41b, and the like, as depicted in FIG. 6B, the contact 40a, the contact 40b, and the like, and conductors such as the wiring 50a, the wiring 50b that are connected to the contacts 40a, 40b, and the like are formed.

At this time, first a metal material, for example a TiW film and an Au film, that forms the seed layer for plating, described later, is formed by sputtering on the entire surface, that is, on the upper surface of the insulating layer 34 and the inner surfaces of the contact hole 41a and the contact hole 41b. After this, a resist with openings in regions where the wiring 50a, the wiring 50b, and the like are to be formed is formed on the seed layer, and a wiring metal material, for example an Au film, that forms the wiring 50a, 50b, and the like is deposited on the seed layer by electroplating using the seed layer as a feeding layer. After this, the resist is removed and the seed layer that is exposed after removal of the resist is removed by etching. By doing so, as depicted in FIG. 6B, the contact 40a that is connected to the electrode 12, the wiring 50a connected to the contact 40a, the contact 40b that is connected to the electrode 13, and the wiring 50b connected to the contact 40b are formed. In addition, although omitted from the drawings, the contact connected to the gate electrode 11 and the wiring connected to this contact are formed.

Figure 6C:
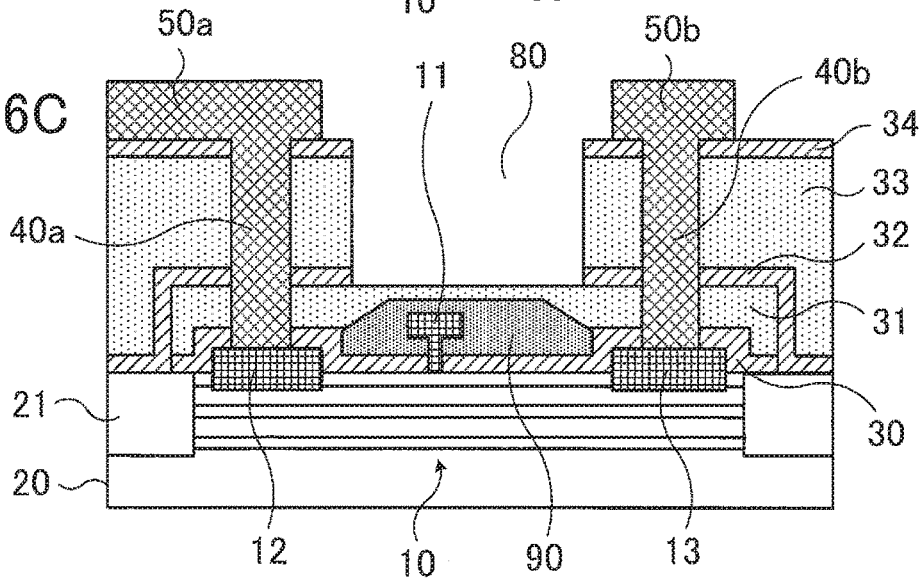

After formation of the contact 40a, the contact 40b, and the like, and formation of the wiring 50a, the wiring 50b, and the like, the opening 80 that passes through the insulating layer 34, the insulating layer 33, and the insulating layer 32 is formed as depicted in FIG. 6C.

The insulating layer 34, the insulating layer 33, and the insulating layer 32 are removed in a region corresponding to the sacrificial layer 90 formed by patterning so as to keep the predetermined disposed region mentioned above, that is, a region that overlaps all or part of the sacrificial layer 90 when looking from above, thereby forming the opening 80. The insulating layer 34, the insulating layer 33, and the insulating layer 32 are removed using a photolithography technique and an etching technique. As one example, a resist with an opening in a predetermined region is formed, the insulating layer 34 is removed by etching using the resist as a mask, and the insulating layer 33 and the insulating layer 32 are then removed in that order. The etching conditions (etching gas, etching time, and the like) of the insulating layer 34, the insulating layer 33, and the insulating layer 32 are set based on the materials used for each layer, the thicknesses, and the like.

After formation of the opening 80, as depicted in FIG. 7A, the sacrificial layer 90 under the insulating layer 31 is removed to form the cavity 31a.

When doing so, as one example, light, such as ultraviolet rays that pass through the insulating layer 31, is irradiated onto the sacrificial layer 90 through the insulating layer 31 in a vacuum. The sacrificial layer 90 decomposes due to the incident light and is gasified. The components of the gasified sacrificial layer 90 are discharged to outside the insulating layer 31 through the holes in the porous insulating layer 31. By doing so, the cavity 31a is formed in the insulating layer 31.

Here, due to the opening 80 formed on the insulating layer 31 above the sacrificial layer 90, a structure is produced where the insulating layer 32, the insulating layer 33, and the insulating layer 34 have been partially removed.

Out of the insulating layer 32, the insulating layer 33, and the insulating layer 34, the insulating layer 32 and the insulating layer 34 that use SiN or the like have a property of relatively low transmittance for light such as ultraviolet rays. Since the insulating layer 32, the insulating layer 33, and the insulating layer 34 present on the insulating layer 31, which include the insulating layer 32 and the insulating layer 34 with the property described above, are removed from above the sacrificial layer 90, it becomes easier for light such as ultraviolet rays to reach the sacrificial layer 90, which improves the efficiency of decomposition and gasification of the sacrificial layer 90.

In addition, the insulating layer 32 and the insulating layer 34 that use SiN or the like have a further property of being relatively dense films. Since the insulating layer 32, the insulating layer 33, and the insulating layer 34 on the insulating layer 31, which include the insulating layer 32 and the insulating layer 34 with this further property, are removed from above the sacrificial layer 90, it becomes easier for the gasified sacrificial layer 90 to be discharged to outside the insulating layer 31, which improves the efficiency of removal of the sacrificial layer 90.

By forming the opening 80 above the sacrificial layer 90, it is possible to form a stable cavity 31a where the sacrificial layer 90 does not remain under the insulating layer 31, that is, where the sacrificial layer 90 is prevented from remaining as residue around the gate electrode 11.

By performing the steps that have been described above with reference to FIGS. 5A to 5C, FIGS. 6A to 6C, and FIG. 7A, the semiconductor device 1A described above (see FIG. 2) is obtained.

With the semiconductor device 1A, since the insulating layer 32 and the insulating layer 34 of SiN or the like that have a relatively high permittivity are removed from above the cavity 31a and the sacrificial layer 90 is prevented from remaining as residue around the gate electrode 11 in the cavity 31a, generation of parasitic capacitance caused by these layers is suppressed. By doing so, the semiconductor device 1A, for which deterioration in the characteristics due to parasitic capacitance is suppressed, is realized.

When formation of the cavity 31a (i.e., removal of the sacrificial layer 90) as depicted in FIG. 7A is followed by filling the opening 80 above the cavity 31a with the insulating layer 35 as depicted in FIG. 7B, the semiconductor device 1B (see FIG. 4) is obtained. As one example, after the formation of the cavity 31a, the opening 80 is filled by spin coating or the like with a material that has a lower permittivity than the material, such as SiN, used for the insulating layer 32.

With the semiconductor device 1B, by filling the opening 80 with the insulating layer 35, the resistance to moisture is improved. By doing so, the semiconductor device 1B, in which penetration of moisture into the cavity 31a and the HEMT 10 and resulting deterioration in the characteristics of the HEMT 10 are suppressed, is realized.

When forming the semiconductor device 1B, the step of filling the opening 80 with the insulating layer 35 is not limited to being performed after formation of the cavity 31a and may be performed before the formation of the cavity 31a.

Figure 8A:
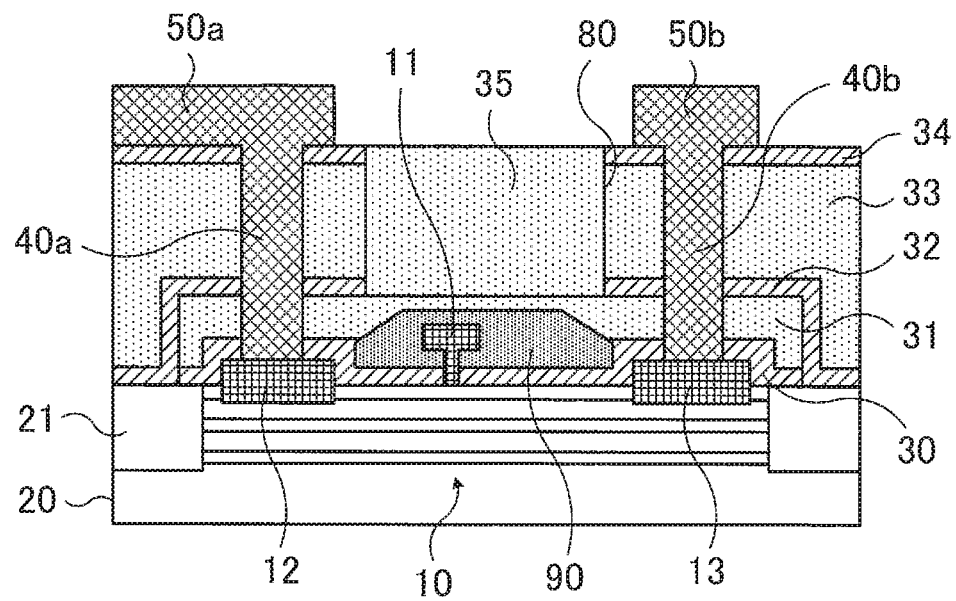
FIGS. 8A and 8B are fourth diagrams depicting a method for forming a semiconductor device according to the second embodiment.
Figure 8B:
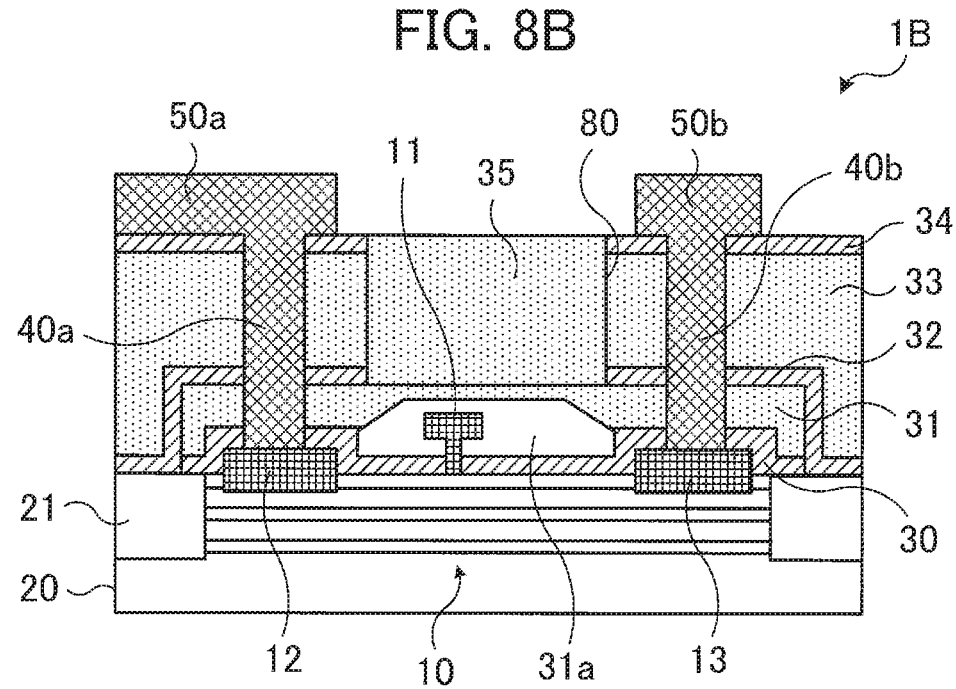

That is, after formation of the opening 80 depicted in FIG. 6C, the opening 80 is filled with the insulating layer 35 as depicted in FIG. 8A without removing the sacrificial layer 90. After this, as depicted in FIG. 8B, the sacrificial layer 90 is removed to form the cavity 31a. For the insulating layer 35, a porous material with a relatively high transmittance of light such as ultraviolet rays and a relatively low density is used. When this type of insulating layer 35 is used, even when the opening 80 is filled with the insulating layer 35 before the formation of the cavity 31a (i.e., before removal of the sacrificial layer 90), light will still reach the sacrificial layer 90 to cause decomposition and gasification, and the gasified components are discharged through the holes in the insulating layer 31 and the insulating layer 35. When a material with higher porosity than the insulating layer 31 is used for the insulating layer 35, it is possible to increase the efficiency of removal of the sacrificial layer 90 compared to a case where a material with low porosity is used.

Note that when forming the semiconductor device 1A and the semiconductor device 1B, a step (called "back grinding") of grinding the back surface of the compound semiconductor layer 20 may be performed. Other processes may also be performed, such as formation of vias that pass through the compound semiconductor layer 20 after grinding and are connected to conductors (for example, the contact 40c) on the wiring layer side and formation of electrodes on the back surface of the compound semiconductor layer 20 after grinding. When the back grinding of the compound semiconductor layer 20 is performed in this way, formation of the cavity 31a (see FIG. 7A or 8B) or both formation of the opening 80 (see FIG. 6C) and formation of the cavity 31a (see FIG. 7A or FIG. 8B) may be performed after the back grinding. Since a comparatively large force and/or high heat may act upon the compound semiconductor layer 20 when back grinding is performed, when the cavity 31a is already formed at this time, there is the risk of layers near the cavity 31a peeling off due to the force and/or heat. On the other hand, when the cavity 31a is yet to be formed, that is, when the sacrificial layer 90 is present, it is possible to effectively suppress the peeling of layers in the vicinity of the cavity 31a when back grinding is performed.

Next, a third embodiment will be described.

Here, a modification to the semiconductor device 1A and the semiconductor device 1B described above in the first and second embodiments will be described as a third embodiment.

Figure 9A:
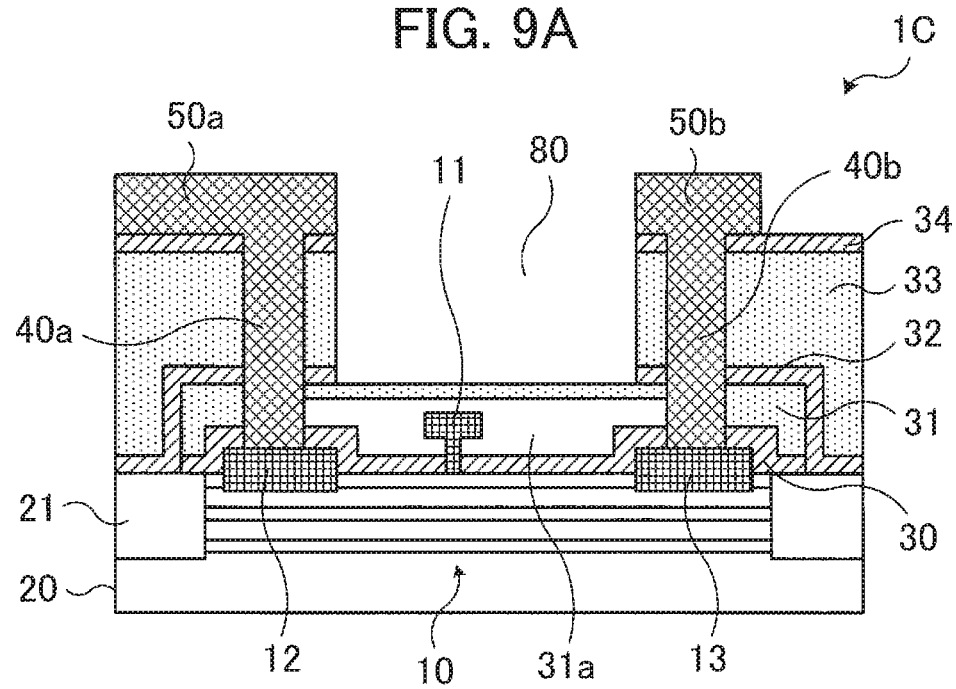
FIGS. 9A and 9B depict a first example configuration of a semiconductor device according to a third embodiment.
Figure 9B:
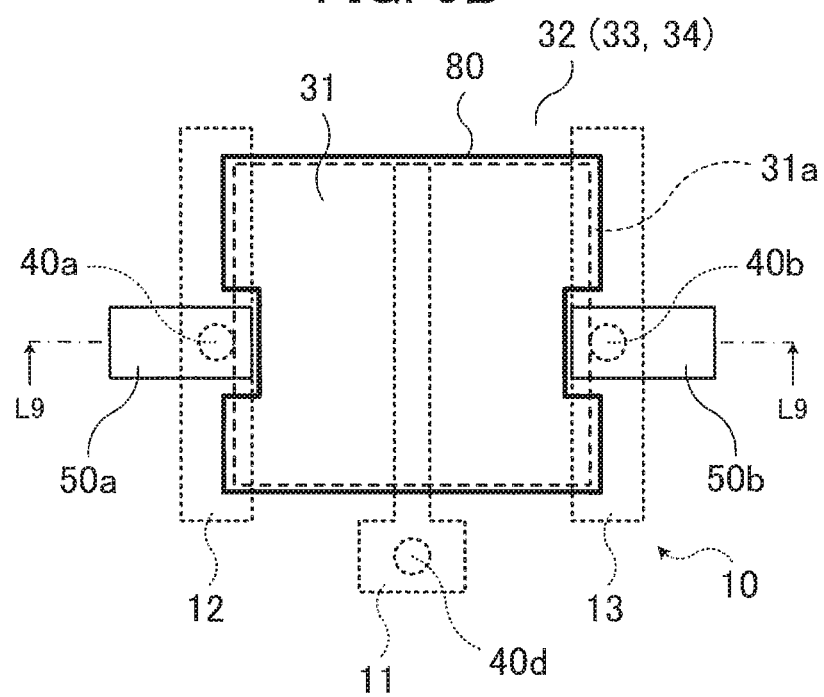

FIGS. 9A and 9B depict a first example configuration of a semiconductor device according to the third embodiment. FIG. 9A schematically depicts a principal part of the first example configuration of the semiconductor device according to the third embodiment in cross section. FIG. 9B schematically depicts the planar layout of a principal part of the first example configuration of the semiconductor device according to the third embodiment. Note that FIG. 9A is a schematic cross-sectional view corresponding to the position of a line L9-L9 in FIG. 9B.

In the semiconductor device 1C depicted in FIG. 9A, the cavity 31a provided in the insulating layer 31 that covers the gate electrode 11 is formed so as to extend to the positions of (the contact 40a and the contact 40b connected to) the electrode 12 and the electrode 13 respectively used as a source electrode and a drain electrode. The opening 80 is provided in the insulating layer 32 (and the insulating layer 33 and the insulating layer 34) on the insulating layer 31 corresponding to this cavity 31a. The semiconductor device 1C differs from the semiconductor device 1A described above in this respect.

As depicted in FIG. 9B for example, when looking from above, the opening 80 provided corresponding to the cavity 31a is provided above the cavity 31a while avoiding the wiring 50a and the wiring 50b connected to the contact 40a and the contact 40b. By widening the cavity 31a and widening the opening 80 that is provided corresponding to the cavity 31a, the insulating layer 32 with a relatively high permittivity that remains above the HEMT 10 is reduced, which reduces the parasitic capacitance caused by the insulating layer 32. By doing so, a semiconductor device 1C where deterioration in the characteristics due to parasitic capacitance is suppressed is realized.

Figure 10A:
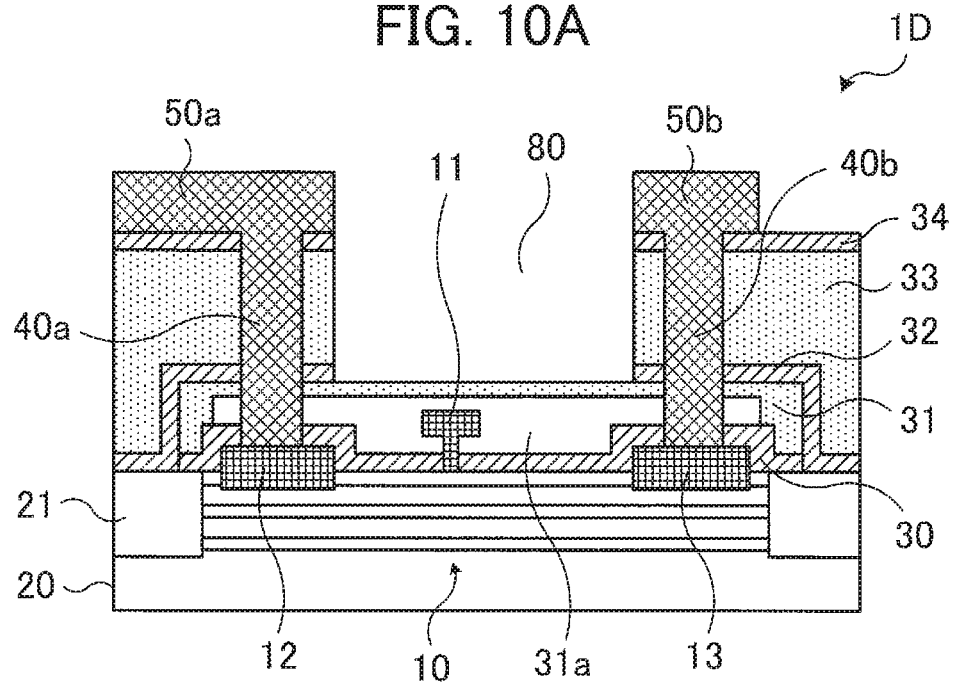
FIGS. 10A and 10B depict a second example configuration of a semiconductor device according to the third embodiment.
Figure 10B:
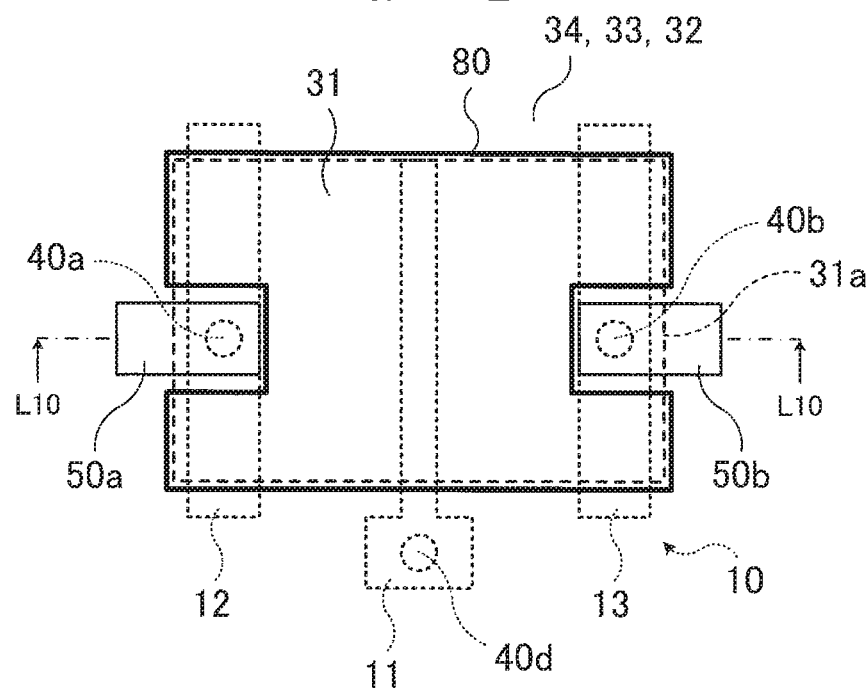

FIGS. 10A and 10B depict a second example configuration of a semiconductor device according to the third embodiment. FIG. 10A schematically depicts a principal part of the second example configuration of the semiconductor device according to the third embodiment in cross section. FIG. 10B schematically depicts the planar layout of a principal part of the second example configuration of the semiconductor device according to the third embodiment. Note that FIG. 10A is a schematic cross-sectional view corresponding to the position of a line L10-L10 in FIG. 10B.

In a semiconductor device 1D depicted in FIG. 10A, the cavity 31a provided in the insulating layer 31 that covers the gate electrode 11 is formed so as to extend to positions outside (the contact 40a and the contact 40b connected to) the electrode 12 and the electrode 13 respectively used as the source electrode or the drain electrode. The opening 80 is provided in the insulating layer 32 (and the insulating layer 33 and the insulating layer 34) on the insulating layer 31 corresponding to this cavity 31a. The semiconductor device 1D differs from the semiconductor device 1A described above in this respect.

As depicted in FIG. 10B for example, when looking from above, the opening 80 provided corresponding to the cavity 31a is provided above the cavity 31a while avoiding the wiring 50a and the wiring 50b connected to the contact 40a and the contact 40b. By widening the cavity 31a and widening the opening 80 that is provided corresponding to the cavity 31a, the insulating layer 32 with a relatively high permittivity that remains above the HEMT 10 is reduced, which reduces the parasitic capacitance caused by the insulating layer 32. By doing so, a semiconductor device 1D where deterioration in the characteristics due to parasitic capacitance is suppressed is realized.

Note that the planar forms of the openings 80 in the semiconductor device 1C and the semiconductor device 1D are not limited to the examples described above. It is possible to set the planar form of the opening 80 based on the layout of the cavity 31a, as well as the contact 40a and the contact 40b and the wiring 50a and the wiring 50b connected to the contacts 40a and 40b.

Also, in keeping with the example of the semiconductor device 1B described above, the openings 80 in the semiconductor device 1C and the semiconductor device 1D may be filled with the insulating layer 35 which uses a material with a lower permittivity than the material, such as SiN, used for the insulating layer 32.

It is possible to form the semiconductor device 1C and the semiconductor device 1D by appropriately changing the disposed region of the sacrificial layer 90 (see FIG. 5B) and the disposed region of the opening 80 (see FIG. 6C) in accordance with the example method for forming described in the second embodiment.

Next, a fourth embodiment will be described.

Here, a number of alternative examples of methods of forming a semiconductor device will be described as the fourth embodiment.

FIGS. 11A to 11C and FIGS. 12A and 12B depict an example of a method for forming a semiconductor device according to the fourth embodiment. FIGS. 11A to 11C and FIGS. 12A and 12B schematically depict a principal part in each step in the method for forming a semiconductor device according to the fourth embodiment in cross section.

Figure 11A:
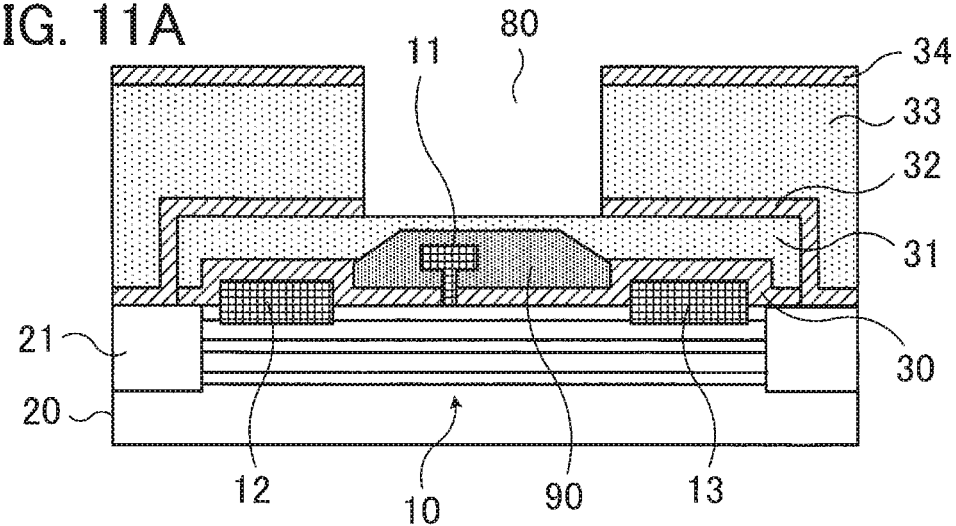
FIGS. 11A to 11C are first diagrams depicting an example of a method for forming a semiconductor device according to a fourth embodiment.

In this example, after the steps in FIGS. 5A to 5C described in the second embodiment given above, as depicted in FIG. 11A, an opening 80 that passes through the insulating layer 34, the insulating layer 33, and the insulating layer 32 is formed. The opening 80 is formed in a predetermined region by using a photolithography technique and an etching technique according to the example steps depicted in FIG. 6C described above.

Figure 11B:
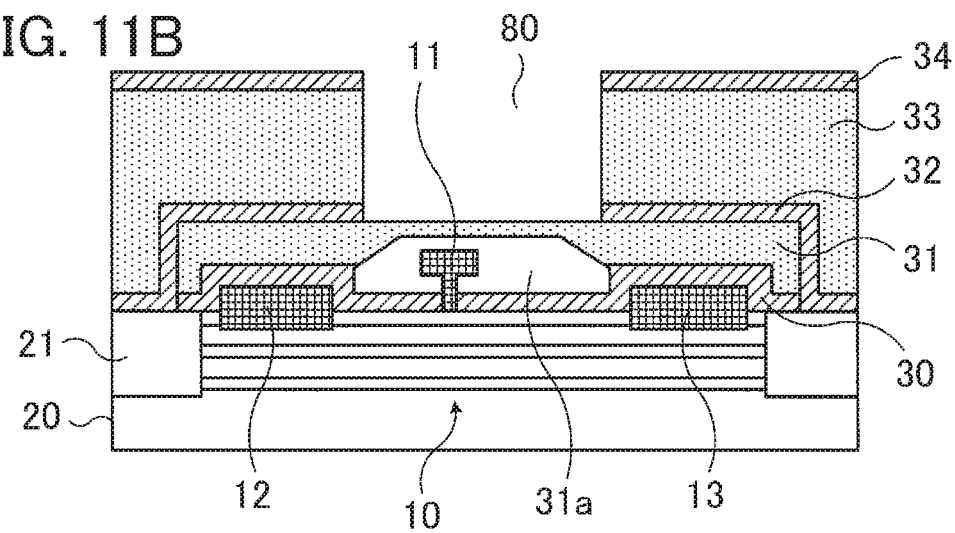

After formation of the opening 80, as depicted in FIG. 11B, the sacrificial layer 90 below the insulating layer 31 is removed to form the cavity 31a. The cavity 31a is formed in accordance with the example steps in FIG. 7A described above by decomposing and gasifying the sacrificial layer 90 via irradiation with light, such as ultraviolet rays, and discharging the components of the gasified sacrificial layer 90 to outside the insulating layer 31 through the holes in the porous insulating layer 31.

Figure 11C:
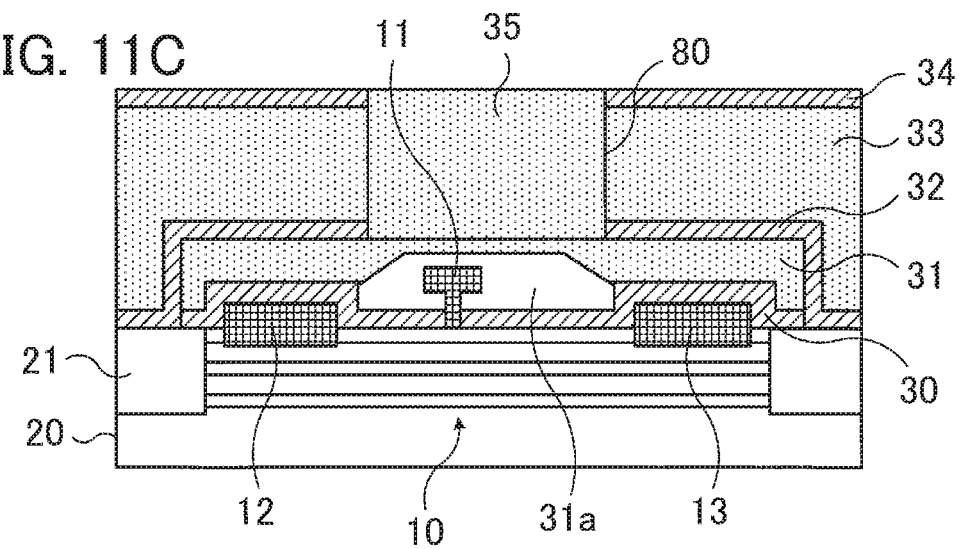

After formation of the cavity 31a, as depicted in FIG. 11C, the opening 80 is filled with the insulating layer 35 that uses a material with a lower permittivity than the material, such as SiN, used for the insulating layer 32.

Note that in accordance with the example depicted in FIGS. 8A and 8B described above, after the opening 80 has been filled with the insulating layer 35 following the formation of the opening 80, the sacrificial layer 90 may be removed through the holes in the insulating layer 31 and the insulating layer 35 to form the cavity 31a.

Figure 12A:
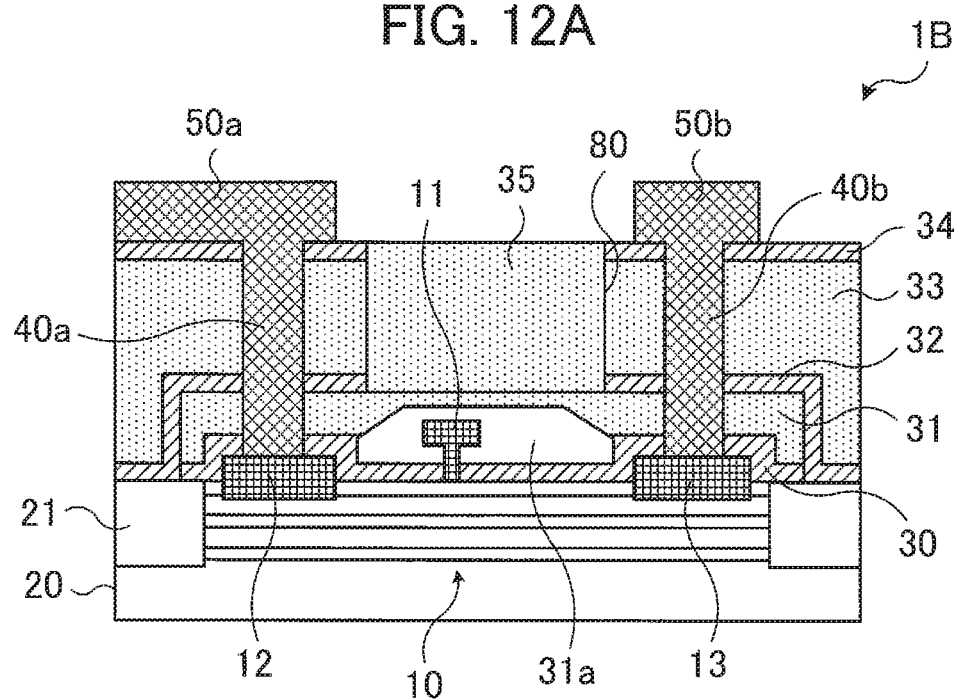
FIGS. 12A and 12B are second diagrams depicting an example of a method for forming a semiconductor device according to the fourth embodiment.

After formation of the cavity 31a and the insulating layer 35, as depicted in FIG. 12A, the contact 40a, the contact 40b, and the like and the wiring 50a, the wiring 50b and the like connected to the contacts 40a, 40b and the like are formed. This is performed in accordance with the example steps in FIGS. 6A and 6B described above.

The semiconductor device 1B may be obtained using this method.

Figure 12B:
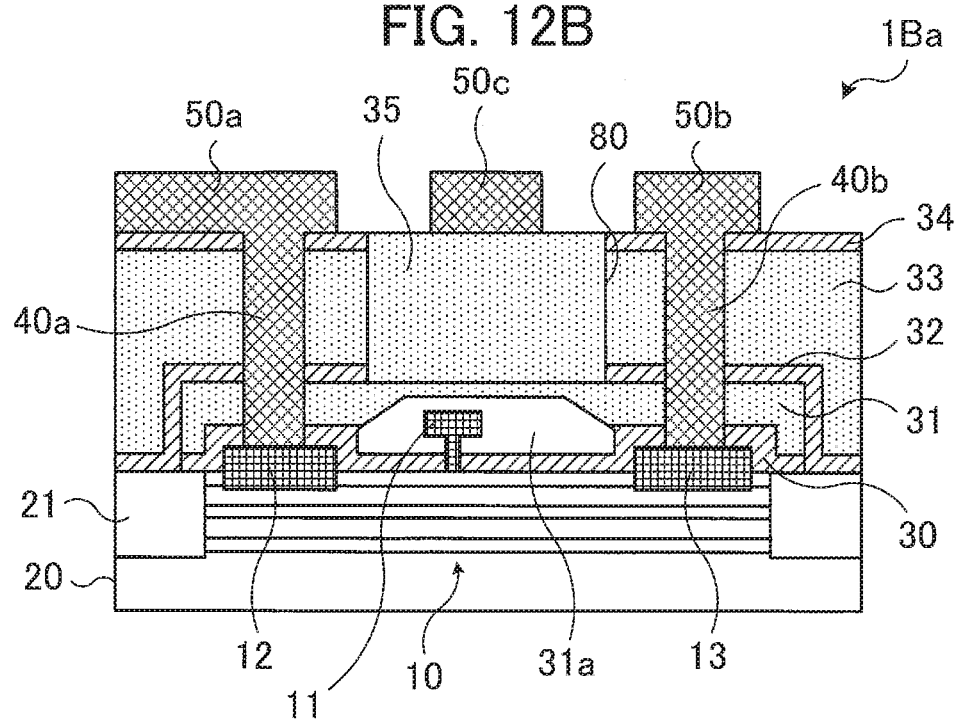

In a method that forms the wiring 50a, the wiring 50b, and the like after forming the cavity 31a and the insulating layer 35 that fills the opening 80 in this way, like the semiconductor device 1B depicted in FIG. 12B, it is possible to form wiring 50c on the insulating layer 35 that fills the opening 80. The wiring 50c may be formed separate from the wiring 50a, the wiring 50b, and the like. Alternatively, the wiring 50c may be connected to or integrally formed with one of the wiring 50a, the wiring 50b, and the like. Since it is possible to also form the wiring 50c on top of the insulating layer 35 that fills the opening 80, it is possible to increase the freedom with which the wiring is laid out in a semiconductor device 1Ba.

Note that when back grinding is performed on the compound semiconductor layer 20, after back grinding, formation of the cavity 31a or both formation of the opening 80 and formation of the cavity 31a may be performed. In this way, when back grinding is performed in a state where the cavity 31a is yet to be formed (i.e., where the sacrificial layer 90 is formed), it is possible to effectively suppress peeling of the layers near the cavity 31a due to force and/or heat applied during back grinding.

The insulating layers provided on the compound semiconductor layer 20 are not limited to the insulating layers 30 to 35 described above. As one example, it is possible to produce a structure formed using the method depicted in FIGS. 13A to 15B described below.

FIGS. 13A to 15B depict different examples of methods of forming a semiconductor device according to the fourth embodiment. FIGS. 13A to 13C, FIGS. 14A to 14C, and FIGS. 15A and 15B schematically depict a principal part at each step in other example methods of forming a semiconductor device according to the fourth embodiment in cross section.

Figure 13A:
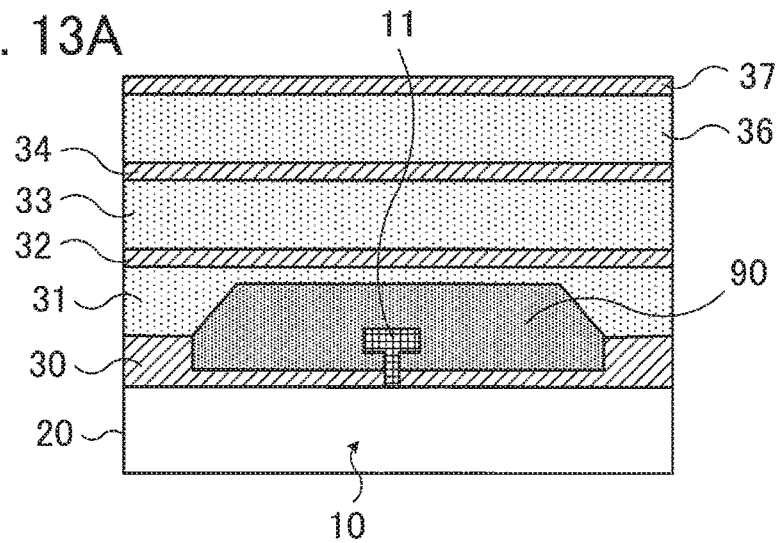
FIGS. 13A to 13C depict a different example of a method for forming a semiconductor device according to the fourth embodiment.
Figure 13B:
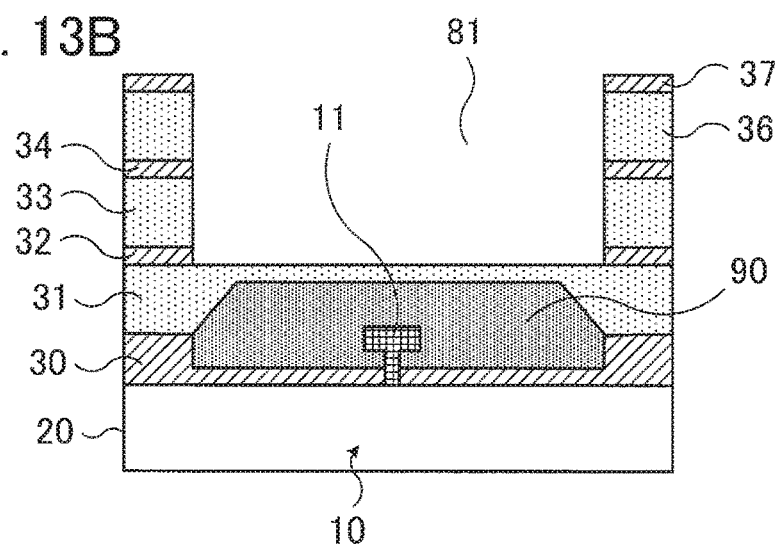
Figure 13C:
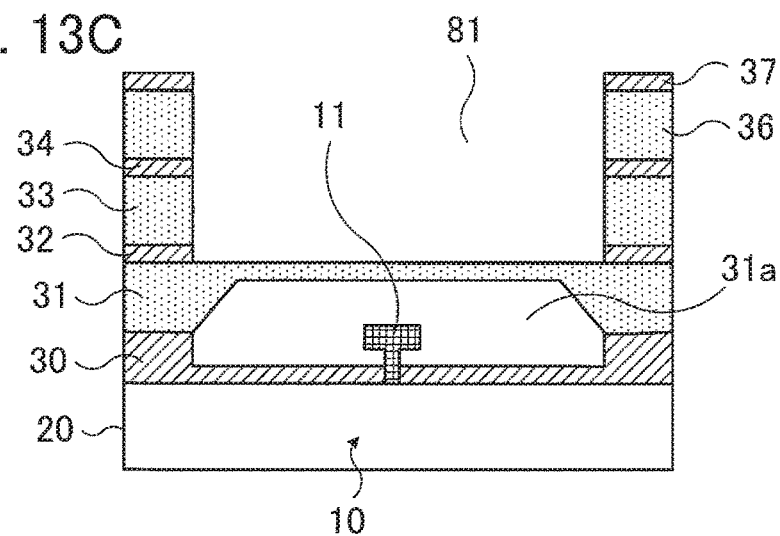

In the method depicted in FIGS. 13A to 13C, steps up to the formation of the insulating layer 34 are performed first and then as depicted in FIG. 13A, formation of an insulating layer 36 with a relatively low permittivity and an insulating layer 37 with a relatively high permittivity is performed. After this, as depicted in FIG. 13B, the opening 80 that passes through from the insulating layer 37 as far as the insulating layer 32 is formed, and by irradiating with light, such as ultraviolet rays, as depicted in FIG. 13C, the sacrificial layer 90 is removed through the porous insulating layer 31 to form the cavity 31a.

In the method depicted in FIGS. 14A to 14C, first after the steps up to formation of the insulating layer 35 have been performed without removing the sacrificial layer 90, as depicted in FIG. 14A, the insulating layer 36 that has a relatively low permittivity and the insulating layer 37 that has a relatively high permittivity are formed. After this, as depicted in FIG. 14B, an opening 82 that passes through the insulating layer 37 and the insulating layer 36 is formed, and the opening 82 is filled with a porous insulating layer 38 that has a relatively low permittivity (as one example, an insulating layer 38 whose porosity is equal to or higher than the insulating layer 31 and the insulating layer 35). After this, through irradiation with light such as ultraviolet rays, as depicted in FIG. 14C, the sacrificial layer 90 is removed through the porous insulating layer 31 and the insulating layer 38 to form the cavity 31a.

Figure 15A:
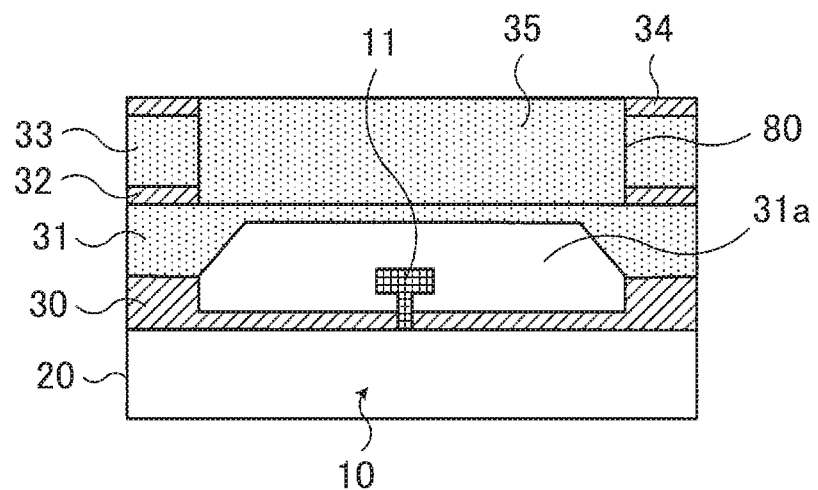
FIGS. 15A and 15B depict a different example of a method for forming a semiconductor device according to the fourth embodiment.
Figure 15B:
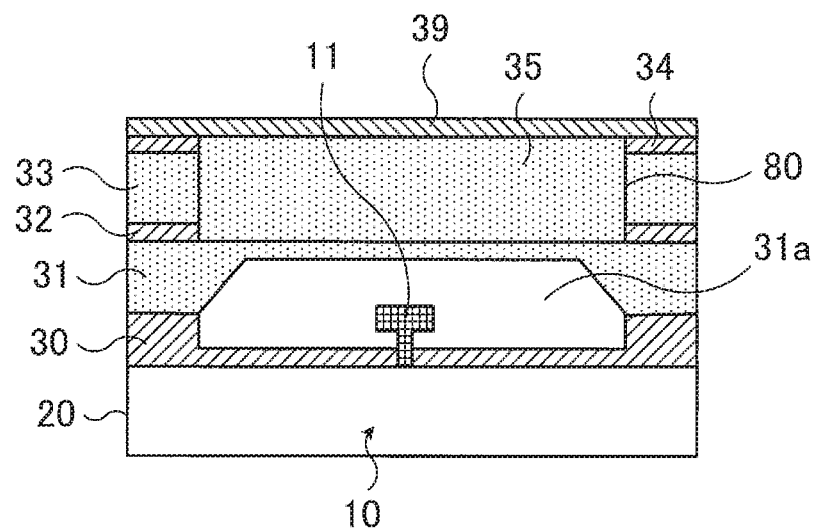

In the method depicted in FIGS. 15A and 15B, first, after formation of the opening 80, the structure depicted in FIG. 15A is obtained by removing the sacrificial layer 90 to form the cavity 31a and then filling the opening 80 with the insulating layer 35, or alternatively by filling the opening 80 with the insulating layer 35 and then removing the sacrificial layer 90 to form the cavity 31a. After this, as depicted in FIG. 15B, an insulating layer 39 with higher resistance to moisture than the insulating layer 35 is formed in a region that includes an area above the insulating layer 35 that fills the opening 80. By doing so, penetration of moisture into the cavity 31a and the HEMT 10 and deterioration in the characteristics of the HEMT 10 due to moisture are suppressed. Note that although the insulating layer 39 with high resistance to moisture that is formed on the insulating layer 35 may have a higher permittivity than the insulating layer 31 and the insulating layer 35, since the insulating layer 39 is further from the gate electrode 11 than the insulating layer 32, it is possible to suppress the generation of parasitic capacitance due to the insulating layer 39.

It is possible to obtain a semiconductor device using methods like those depicted in FIGS. 13A to 13C, FIGS. 14A to 14C, and FIGS. 15A and 15B. When producing an MMIC semiconductor device, it is possible to make various changes to the composition and structure of the insulating layers provided on the compound semiconductor layer 20, and by appropriately changing the steps in keeping with such changes, it is possible to provide the opening 80 and the like and the cavity 31a.

Next, a fifth embodiment will be described.

Although semiconductor devices provided with a cavity surrounding the gate electrode of a HEMT have been described above as examples, it is also possible to apply the methods described above to the wiring layers of a semiconductor device. An example of this is described below as a fifth embodiment.

Figure 16A:
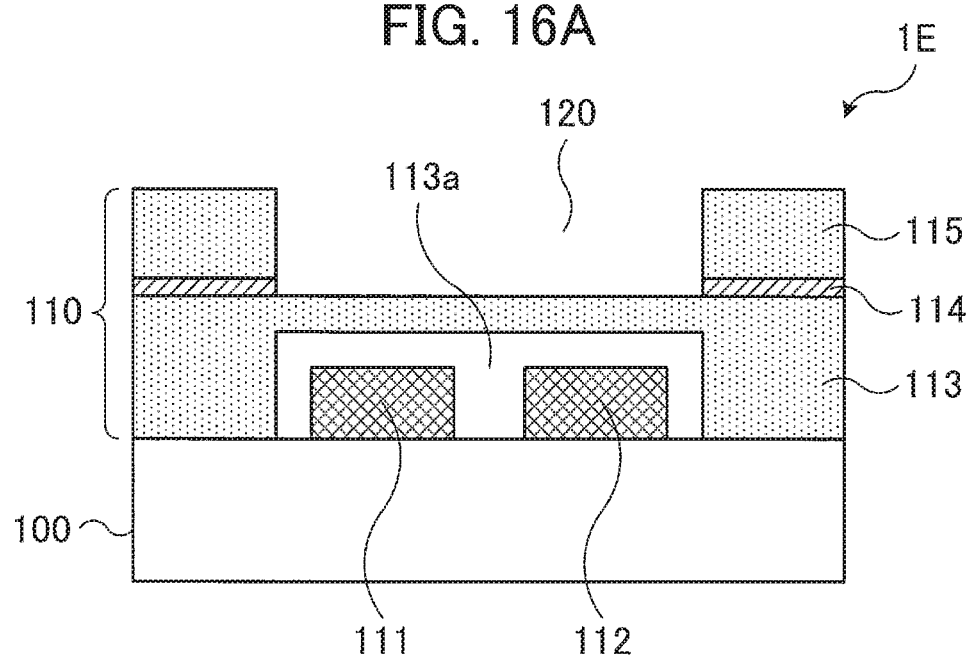
FIGS. 16A and 16B depict one example of a semiconductor device according to a fifth embodiment.
Figure 16B:
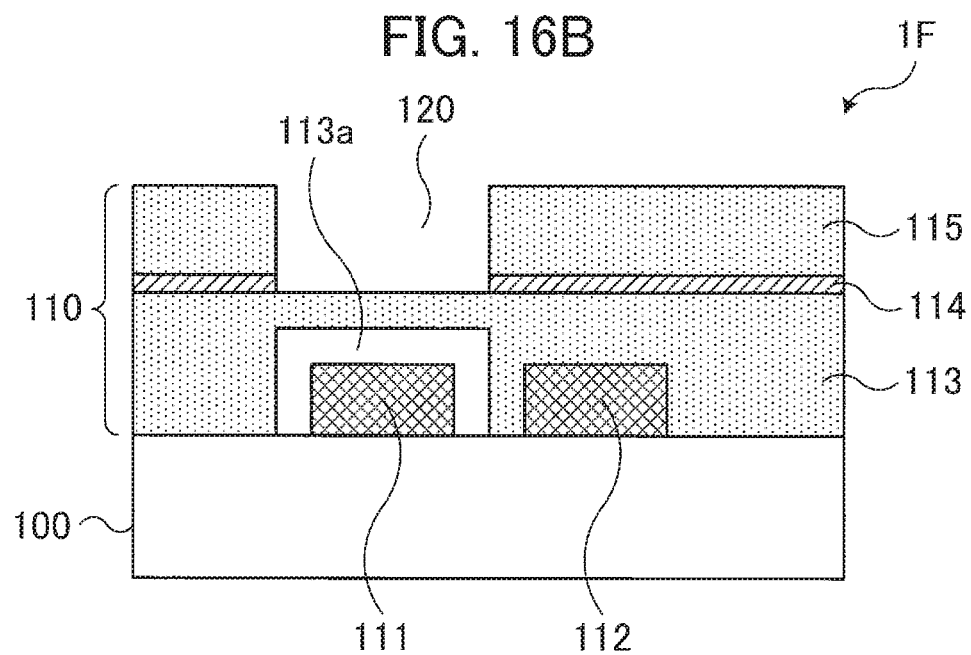

FIGS. 16A and 16B depict one example of a semiconductor device according to the fifth embodiment. FIGS. 16A and 16B schematically depict a principal part of the semiconductor device according to the fifth embodiment in cross section.

A semiconductor device 1E depicted in FIG. 16A and a semiconductor device 1F depicted in FIG. 16B are each equipped with a substrate 100, which includes transistors (semiconductor elements) formed on a semiconductor substrate and one or two or more wiring layers, and a wiring layer 110 provided on the substrate 100.

The wiring layer 110 includes wiring 111 and wiring 112, an insulating layer 113 that covers the wiring 111 and the wiring 112, and an insulating layer 114 and an insulating layer 115 provided on top of the insulating layer 113.

The wiring 111 and the wiring 112 may be wiring on which electrical signals of different potentials are supplied or may be wiring on which electrical signals of the same potential are supplied.

A material, such as a Low-k material, with a relatively low permittivity is used as the insulating layer 113. As depicted in FIG. 16A for example, the insulating layer 113 has a cavity 113a that surrounds the wiring 111 and the wiring 112. Alternatively, as depicted in FIG. 16B for example, the insulating layer 113 includes the cavity 113a that surrounds one out of the wiring 111 and the wiring 112 (in the illustrated example, the wiring 111).

The insulating layer 114 that uses a material, such as SiN, with a relatively high permittivity, is provided on the insulating layer 113 and the insulating layer 115 that uses a material, such as a Low-k material, with a relatively low permittivity, is further provided on the insulating layer 114.

The wiring layer 110 is provided with an opening 120 that passes through the insulating layer 114 and the insulating layer 115 above the insulating layer 113, which covers the wiring 111 and the wiring 112 and includes the cavity 113a that surrounds one or both of the wiring 111 and the wiring 112, at a position corresponding to the cavity 113a.

Note that although omitted from the drawing, contacts that are joined to other wiring are connected to the wiring 111 and the wiring 112, for example by passing through the insulating layer 115, the insulating layer 114, and the insulating layer 113.

Since the opening 120 is provided, the wiring layer 110 of the semiconductor device 1E and the semiconductor device 1F is constructed so that the insulating layer 114 that has a relatively high permittivity is partially removed from above (at least part of) the cavity 113a of the insulating layer 113. By doing so, with the semiconductor device 1E and the semiconductor device 1F, the parasitic capacitance generated between the wiring 111 and the wiring 112 positioned inside the cavity 113a or between the wiring 111 and other conductors is reduced, so that deterioration in the characteristics, such as the high frequency characteristics, is suppressed.

FIGS. 17A to 17C and FIGS. 18A to 18C depict a method for forming a semiconductor device according to the fifth embodiment. FIGS. 17A to 17C and FIGS. 18A to 18C schematically depict a principal part at each step in the method for forming a semiconductor device according to the fifth embodiment in cross section.

Figure 17A:
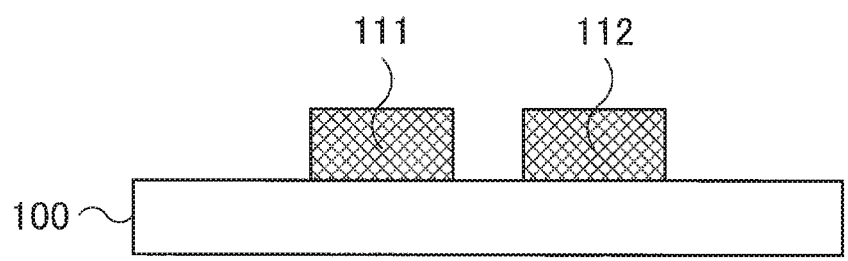
FIGS. 17A to 17C depict (a first part of) a method for forming a semiconductor device according to the fifth embodiment.

First, as depicted in FIG. 17A, the wiring 111 and the wiring 112 are formed on the substrate 100.

Figure 17B:
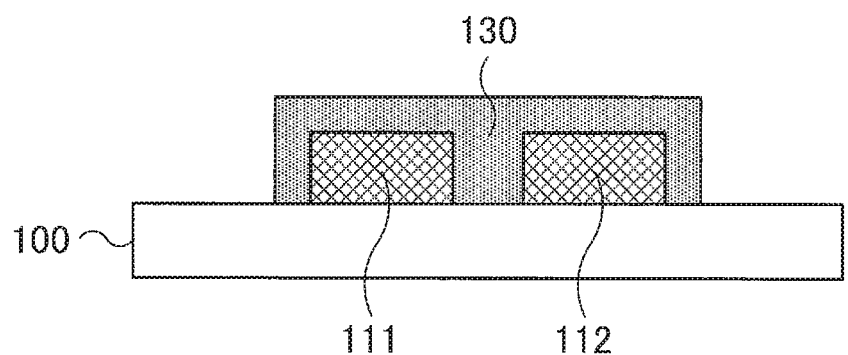

After formation of the wiring 111 and the wiring 112, as depicted in FIG. 17B, a sacrificial layer 130 is formed so as to cover the wiring 111 and the wiring 112. A material that decomposes due to light, such as ultraviolet rays, is used as the sacrificial layer 130. The sacrificial layer 130 is formed in a predetermined region (or "disposed region"), for example a region that incorporates part or all of the wiring 111 and the wiring 112, using a photolithography technique and an etching technique.

Figure 17C:
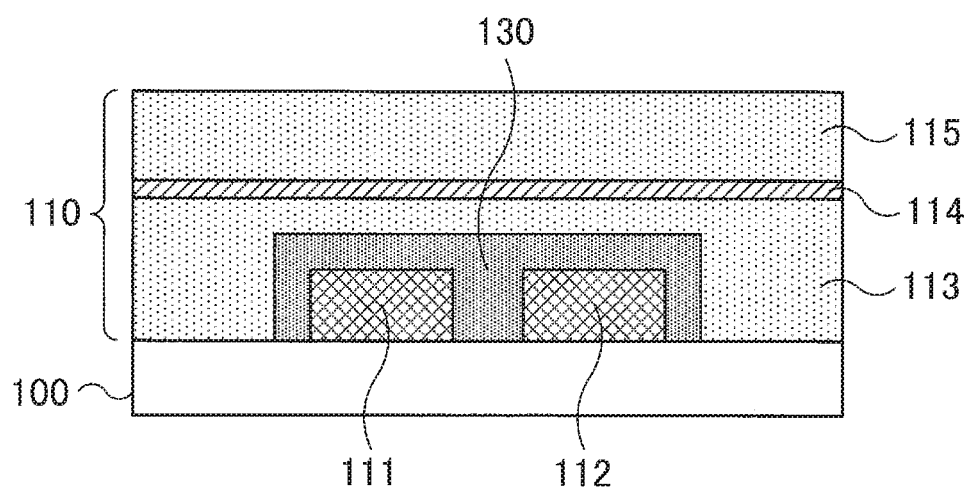

After formation of the sacrificial layer 130, as depicted in FIG. 17C, the insulating layer 113, the insulating layer 114, and the insulating layer 115 are formed. When doing so, the insulating layer 113 is formed using a material with a relatively high permittivity so as to cover the sacrificial layer 130, the insulating layer 114 is formed using a material with a relatively low permittivity on top of the insulating layer 113, and then the insulating layer 115 is formed using a material with a relatively low permittivity on the insulating layer 114.

After formation of the insulating layer 113, the insulating layer 114, and the insulating layer 115, as depicted in FIG. 18A, the opening 120 that passes through the insulating layer 115 and the insulating layer 114 is formed. The opening 120 is formed in a region corresponding to the sacrificial layer 130, that is, a region that entirely or partially overlaps the sacrificial layer 130 when looking from above.

After formation of the opening 120, as depicted in FIG. 18B, the sacrificial layer 130 below the insulating layer 113 is removed to form the cavity 113a. As one example, light, such as ultraviolet rays, that is transmitted by the insulating layer 113 is irradiated onto the sacrificial layer 130 through the insulating layer 113 and components of the sacrificial layer 130 produced by the resulting decomposition and gasification of the sacrificial layer 130 are discharged to the outside through the holes in the insulating layer 113 to form the cavity 113a in the insulating layer 113.

By doing so, a semiconductor device 1E like that depicted in FIG. 16A described above is obtained. By changing a disposed region of the sacrificial layer 130 (see FIG. 17B) and the formation region of the opening 120 (see FIG. 18A) corresponding to the sacrificial layer 130, a semiconductor device 1F like that depicted in FIG. 16B described above is obtained.

By forming the opening 120 above the sacrificial layer 130 to partially remove the insulating layer 114 that has a relatively high permittivity, it is possible to sufficiently irradiate the sacrificial layer 130 with light, such as ultraviolet rays, and form a stable cavity 113a where the sacrificial layer 130 is prevented from remaining as residue under the insulating layer 113. By partially removing the insulating layer 114 with the opening 120 to ensure that the sacrificial layer 130 is removed, the generation of parasitic capacitance due to residue of the sacrificial layer 130 is suppressed, thereby realizing the semiconductor device 1E and the semiconductor device 1F where deterioration in the characteristics due to parasitic capacitance is suppressed.

As one example, after formation of the cavity 113a (see FIG. 18B), like a semiconductor device 1Ea depicted in FIG. 18C, the opening 120 may be filled with a porous insulating layer 116 which uses a material with a lower permittivity than the material used for the insulating layer 114. By doing so, resistance to moisture is improved, penetration of moisture into the cavity 113a, deterioration in the wiring 111 and the wiring 112 due to moisture, and resulting deterioration in the characteristics of the semiconductor device 1Ea are suppressed. This also applies to the semiconductor device 1F. Note that the step of filling the opening 120 with the insulating layer 116 may be performed after formation of the opening 120 (see FIG. 18A) but before formation of the cavity 113a (see FIG. 18B). In this case, after formation of the opening 120 (see FIG. 18A), the opening 120 is filled with the porous insulating layer 116, and then the sacrificial layer 130 is removed through the insulating layer 113 and the insulating layer 116 to form the cavity 113a.

When forming a wiring layer 110 like that described above, it is possible to make the various changes described above in the second and fourth embodiments, such as changes to the order of steps when removing the sacrificial layer and/or forming the contacts).

Note that although the semiconductor devices 1E, 1Ea, and 1F that include the wiring layer 110 have been described, it is also possible to use the wiring layer 110 with the configuration described above on a circuit board.

It is also possible to use the semiconductor devices 1A, 1B, 1C, 1D, 1E, 1F, and the like as described above in the first to fifth embodiments in various electronic devices. Example applications in a semiconductor package, a power factor correction circuit, a power supply device, and an amplifier are described below as sixth to ninth embodiments.

First, a sixth embodiment will be described.

Here, a semiconductor package that uses the semiconductor device like those described above will be described as the sixth embodiment.

Figure 19:
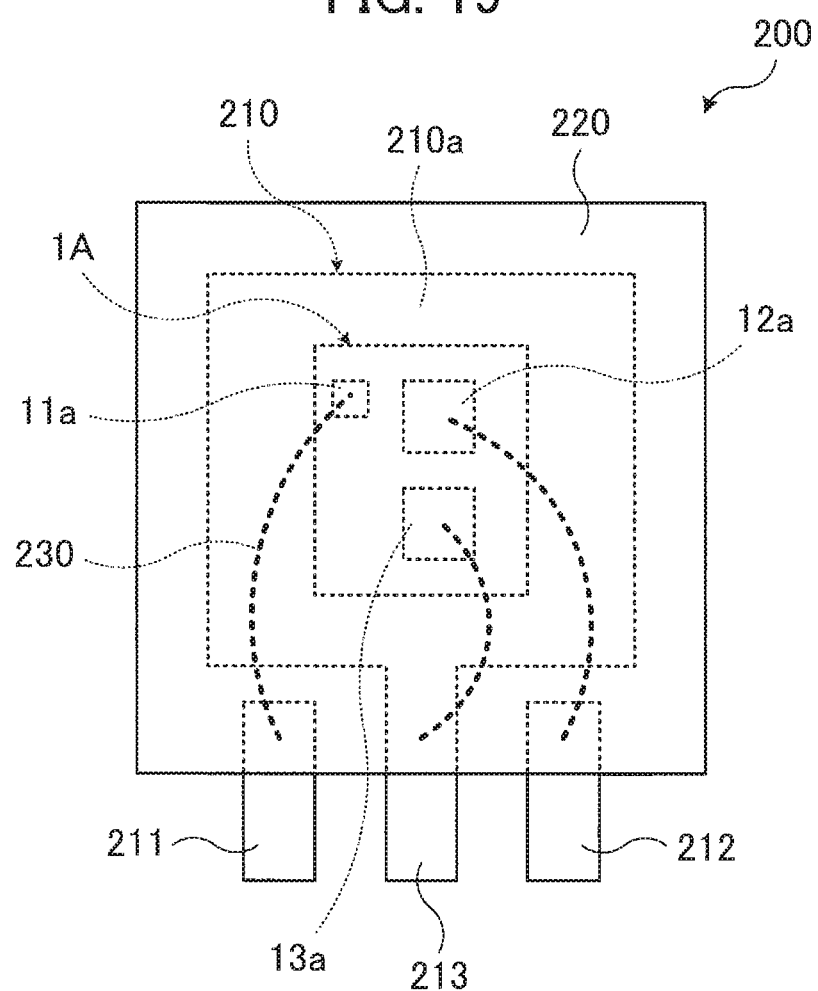
FIG. 19 depicts one example of a semiconductor package according to a sixth embodiment.

FIG. 19 depicts one example of a semiconductor package according to the sixth embodiment. FIG. 19 schematically depicts a principal part of one semiconductor package according to the sixth embodiment in plan view.

A semiconductor package 200 depicted in FIG. 19 includes a lead frame 210 on which the semiconductor device 1A described in the first embodiment, for example, is mounted, and resin 220 that seals the lead frame 210 and the semiconductor device 1A.

The semiconductor device 1A is mounted on die pads 210a of the lead frame 210 using a die attach film or the like, not illustrated. The semiconductor device 1A is provided with a pad 11a connected to the gate electrode 11 of the HEMT 10, and a pad 12a (for example, a source pad) and a pad 13a (for example, a drain pad) connected to the electrode 12 and the electrode 13 described above that each function as a source electrode or a drain electrode. The pad 11a, the pad 12a, and the pad 13a are respectively connected to a gate lead 211, a source lead 212, and a drain lead 213 of the lead frame 210 using wires 230 of aluminum or the like. The lead frame 210, the semiconductor device 1A mounted on the lead frame 210, and the wires 230 used as connections are sealed by the resin 220 so as to expose parts of the gate lead 211, the source lead 212, and the drain lead 213.

The semiconductor package 200 with the configuration described above is obtained using the semiconductor device 1A given in the first embodiment described above, for example.

In the semiconductor device 1A, the cavity 31a is provided so as to surround the gate electrode 11, and by removing the insulating layer 32 with a relatively high permittivity via the opening 80 provided above the cavity 31a, the parasitic capacitance is reduced, which suppresses deterioration in the characteristics, such as high frequency characteristics, due to parasitic capacitance. By using a high-performance semiconductor device like this, a high-performance semiconductor package 200 is realized.

Although the semiconductor device 1A is given here as one example, it is also possible to obtain a semiconductor package with the same high performance using the semiconductor device 1B, 1C, 1D, 1E, 1F, or the like as described above in the second to fifth embodiments.

Next, a seventh embodiment will be described.

A power factor correction circuit that uses a semiconductor device like those described above will now be described as a seventh embodiment.

Figure 20:
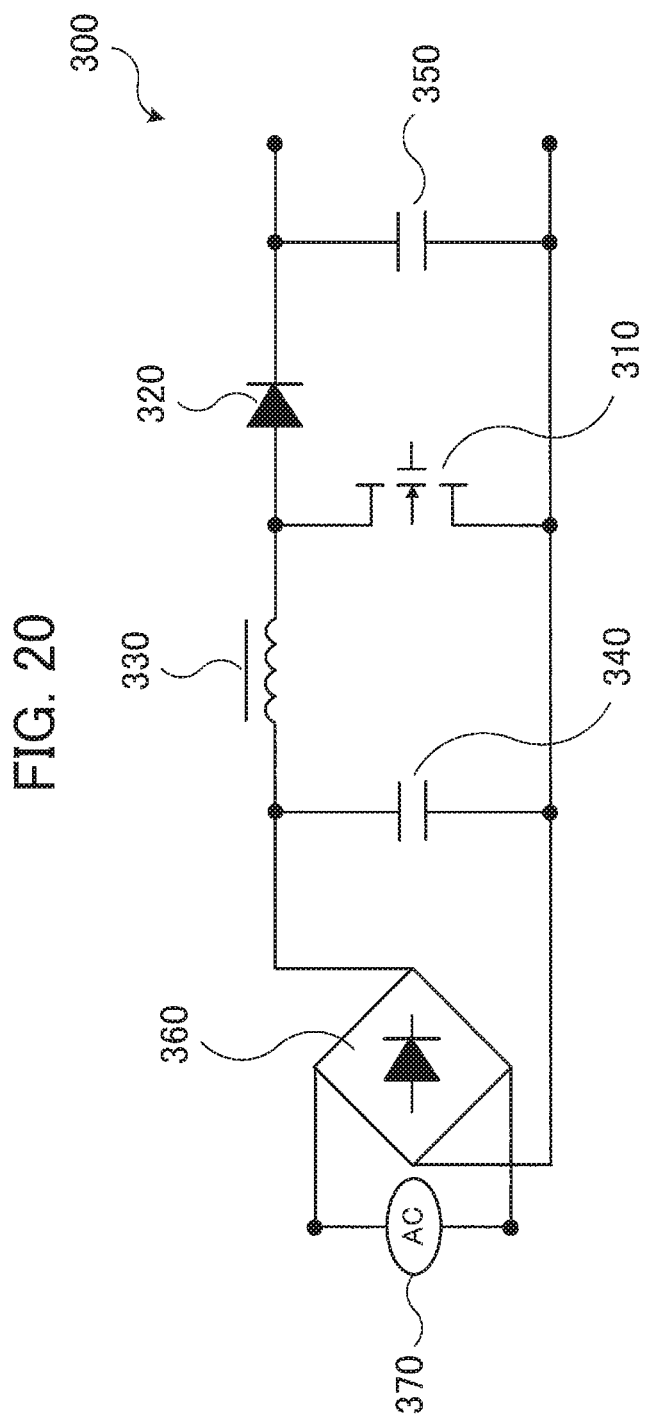
FIG. 20 depicts one example of a power factor correcting circuit according to a seventh embodiment.

FIG. 20 depicts one example of a power factor correcting (PFC) circuit according to the seventh embodiment. FIG. 20 is an equivalent circuit diagram of one example of a PFC circuit according to the seventh embodiment.

The PFC circuit 300 depicted in FIG. 20 includes a switch element 310, a diode 320, a choke coil 330, a capacitor 340, a capacitor 350, a diode bridge 360, and an alternating current (AC) power supply 370.

In the PFC circuit 300, the drain electrode of the switch element 310 is connected to an anode terminal of the diode 320 and to one terminal of the choke coil 330. The source electrode of the switch element 310 is connected to one terminal of the capacitor 340 and one terminal of the capacitor 350. The other terminal of the capacitor 340 and the other terminal of the choke coil 330 are connected. The other terminal of the capacitor 350 and the cathode terminal of the diode 320 are connected. Also, a gate driver is connected to the gate electrode of the switch element 310. The AC power supply 370 is connected via the diode bridge 360 to both terminals of the capacitor 340. A direct current (DC) power supply is connected to both terminals of capacitor 350.

The semiconductor device 1A, 1B, 1C, 1D, 1E, 1F, or the like as described above in the first to fifth embodiments is used as the switch element 310 of the PFC circuit 300 with the configuration described above.

In the semiconductor device 1A, 1B, 1C, 1D, 1E, 1F, or the like, a cavity (the cavity 31a or the cavity 113a described above) is provided so as to surround a conductor (the gate electrode 11, the wiring 111, or the like described above) and an insulating layer (the insulating layer 32 or the insulating layer 114 described above) with a relatively high permittivity is removed by an opening (the opening 80 or the opening 120 described above) provided above the cavity. By doing so, the parasitic capacitance is reduced and deterioration in the characteristics, such as the high-frequency characteristics, due to parasitic capacitance is suppressed. By using a high-performance semiconductor device like this, a high-performance PFC circuit 300 is realized.

Next, an eighth embodiment will be described.

A power supply apparatus that uses a semiconductor device like those described above will now be described as an eighth embodiment.

Figure 21:
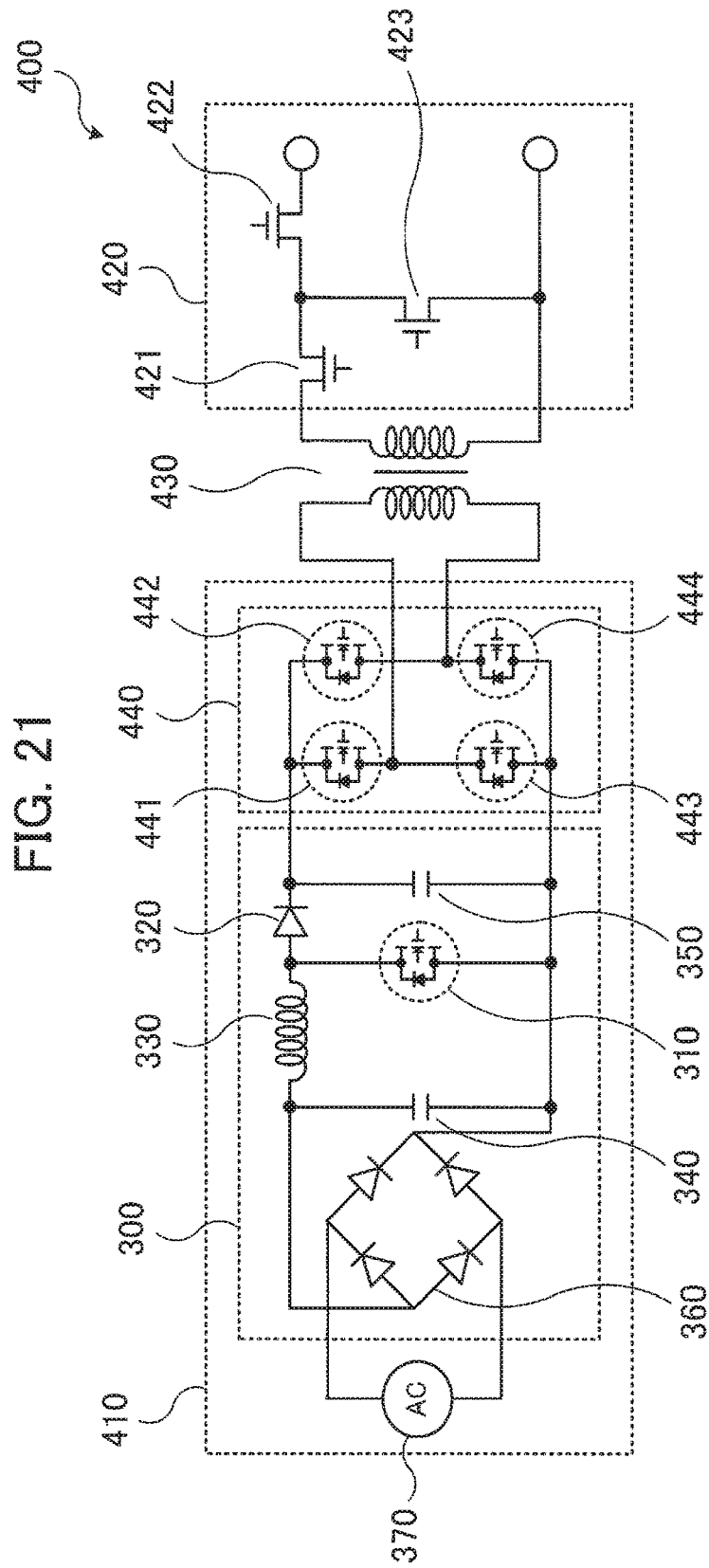
FIG. 21 depicts one example of a power supply apparatus according to an eighth embodiment.

FIG. 21 depicts one example of a power supply apparatus according to the eighth embodiment. FIG. 21 is an equivalent circuit diagram of one example of a power supply apparatus according to the eighth embodiment.

A power supply apparatus 400 depicted in FIG. 21 includes a primary side circuit 410 that is high-voltage, a secondary side circuit 420 that is low-voltage, and a transformer 430 provided between the primary side circuit 410 and the secondary side circuit 420.

The primary side circuit 410 includes a PFC circuit 300 like that described above in the seventh embodiment and an inverter circuit, such as a full-bridge inverter circuit 440, connected between both terminals of the capacitor 350 of the PFC circuit 300. The full-bridge inverter circuit 440 includes a plurality of (as one example here, four) switch elements, a switch element 441, a switch element 442, a switch element 443, and a switch element 444.

The secondary side circuit 420 includes a plurality of (as one example here, three) switch elements, a switch element 421, a switch element 422, and a switch element 423.

In the power supply apparatus 400 of this configuration, the semiconductor device 1A, 1B, 1C, 1D, 1E, 1F, or the like as described above in the first to fifth embodiments is used as the switch element 310 of the PFC circuit 300 included in the primary side circuit 410 and as the switch elements 441 to 444 of the full bridge inverter circuit 440. Normal MIS (Metal Insulator Semiconductor)-type FET (Field Effect Transistors) that use silicon are used as the switch elements 421 to 423 of the secondary side circuit 420 of the power supply apparatus 400.

In each semiconductor device 1A, 1B, 1C, 1D, 1E, 1F, or the like, a cavity (the cavity 31a or the cavity 113a described above) is provided so as to surround a conductor (the gate electrode 11, the wiring 111, or the like described above) and an insulating layer (the insulating layer 32 or the insulating layer 114 described above) with a relatively high permittivity is removed by an opening (the opening 80 or the opening 120 described above) provided above the cavity. By doing so, the parasitic capacitance is reduced and deterioration in the characteristics, such as the high-frequency characteristics, due to parasitic capacitance is suppressed. By using a high-performance semiconductor device like this, a high-performance power supply apparatus 400 is realized.

Next, a ninth embodiment will be described.

An amplifier that uses a semiconductor device like those described above will now be described as a ninth embodiment.

Figure 22:
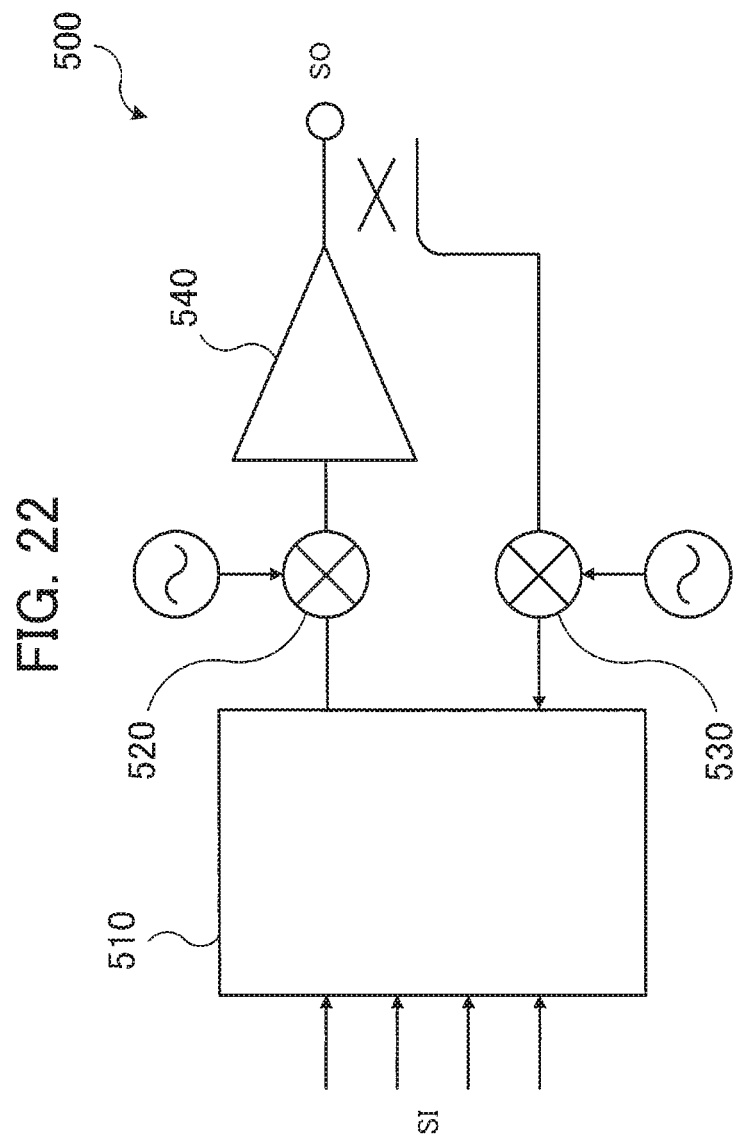
FIG. 22 depicts one example of an amplifier according to a ninth embodiment.

FIG. 22 depicts one example of an amplifier according to the ninth embodiment. FIG. 22 is an equivalent circuit diagram of one example of an amplifier according to the ninth embodiment.

An amplifier 500 depicted in FIG. 22 includes a digital pre-distortion circuit 510, a mixer 520, a mixer 530, and a power amplifier 540.

The digital pre-distortion circuit 510 compensates for nonlinear distortion in an input signal. The mixer 520 mixes the input signal SI, for which nonlinear distortion has been compensated, and an AC signal. The power amplifier 540 amplifies the signal produced by mixing the input signal SI and the AC signal. In the amplifier 500, by switching switches for example, it is possible to mix an output signal SO and an AC signal at the mixer 530 and transmit the mixed signal to the digital pre-distortion circuit 510. The amplifier 500 may be used as a high-frequency amplifier and a high-power amplifier.

In the amplifier 500 of this configuration, the semiconductor device 1A, 1B, 1C, 1D, 1E, 1F, or the like as described above in the first to fifth embodiments is used as the power amplifier 540.

In the semiconductor device 1A, 1B, 1C, 1D, 1E, 1F, or the like, a cavity (the cavity 31a or the cavity 113a described above) is provided so as to surround a conductor (the gate electrode 11, the wiring 111, or the like described above) and an insulating layer (the insulating layer 32 or the insulating layer 114 described above) with a relatively high permittivity is removed by an opening (the opening 80 or the opening 120 described above) provided above the cavity. By doing so, the parasitic capacitance is reduced and deterioration in the characteristics, such as the high-frequency characteristics, due to the parasitic capacitance is suppressed. By using a high-performance semiconductor device like this, a high-performance amplifier 500 is realized.

Various electronic devices that use the semiconductor devices 1A, 1B, 1C, 1D, 1E, 1F and the like (such as the semiconductor package 200, the PFC circuit 300, the power supply apparatus 400, and the amplifier 500 described in the sixth to ninth embodiments) may be installed in various electronic appliances. As examples, it is possible to install the electronic devices in various electronic appliances such as a computer (a personal computer, super computer, server, or the like), a smartphone, a mobile phone, a tablet, a sensor, a camera, audio equipment, a measuring apparatus, a testing apparatus, and a manufacturing apparatus.

A semiconductor device where the generation of parasitic capacitance due to an insulating layer is suppressed is realized. An electronic device equipped with this semiconductor device is also realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a substrate;
   a first conductor provided on the substrate;
   a first insulating layer which is porous, and which is provided on the substrate covers the first conductor, and has a cavity that surrounds the first conductor; and
   a second insulating layer which is provided on the first insulating layer and has an opening at a position corresponding to the cavity.

2. The semiconductor device according to claim 1, wherein the second insulating layer has a higher permittivity than the first insulating layer.

3. The semiconductor device according to claim 1, further comprising a third insulating layer that is provided inside the opening and has a lower permittivity than the second insulating layer.

4. The semiconductor device according to claim 1,
   wherein the substrate is a compound semiconductor layer,
   the first conductor is a gate electrode, and the semiconductor device further includes a source electrode and a drain electrode provided on both sides of the gate electrode on the compound semiconductor layer.

5. The semiconductor device according to claim 1, further comprising a third conductor that is provided on the substrate and is positioned inside the cavity.

6. The semiconductor device according to claim 1, further comprising a fourth conductor that is provided on the substrate and is positioned inside the first insulating layer.

7. The semiconductor device according to claim 3, wherein the third insulating layer is porous.

8. The semiconductor device according to claim 3, further comprising a second conductor provided on the third insulating layer.

9. The semiconductor device according to claim 4, wherein the source electrode and the drain electrode both at least partially overlap the cavity when looking from above.

10. A method for manufacturing a semiconductor device, the method comprising:
   forming a sacrificial layer so as to surround a first conductor provided on a substrate;
   forming a first insulating layer, which covers the first conductor and the sacrificial layer, on the substrate;
   forming a second insulating layer, which includes an opening at a position corresponding to the sacrificial layer, on the first insulating layer, the opening reaching an upper surface of the first insulating layer, the upper surface being a bottom surface of the opening; and
   removing the sacrificial layer through the first insulating layer, the upper surface as the bottom surface, and the opening, to form a cavity that is provided in the first insulating layer and surrounds the first conductor.

11. The method for manufacturing a semiconductor device according to claim 10, further comprising forming a third insulating layer, which has a lower permittivity than the second insulating layer, inside the opening.

12. An electronic device comprising a semiconductor device which includes:
   a substrate;
   a first conductor provided on the substrate;
   a first insulating layer which is porous, and which is provided on the substrate, covers the first conductor, and has a cavity that surrounds the first conductor; and
   a second insulating layer which is provided on the first insulating layer and has an opening at a position corresponding to the cavity.

* * * * *